United States Patent
Babazadeh

(10) Patent No.: US 10,056,834 B2
(45) Date of Patent: Aug. 21, 2018

(54) OUTPUT CAPACITANCE CALCULATION AND CONTROL IN A POWER SUPPLY

(71) Applicant: Infineon Technologies Austria AG, Villach (AT)

(72) Inventor: Amir Babazadeh, Laguna Hills, CA (US)

(73) Assignee: Infineon Technologies Austria AG, Villach (AU)

( * ) Notice: Subject to any disclaimer, the term of this patent is extended or adjusted under 35 U.S.C. 154(b) by 144 days.

(21) Appl. No.: 14/856,788

(22) Filed: Sep. 17, 2015

(65) Prior Publication Data
US 2017/0085174 A1    Mar. 23, 2017

(51) Int. Cl.
| G05F 1/00 | (2006.01) |
| H02M 3/158 | (2006.01) |
| G01R 31/02 | (2006.01) |
| H02M 3/157 | (2006.01) |
| H02M 1/00 | (2006.01) |

(52) U.S. Cl.
CPC .......... H02M 3/158 (2013.01); G01R 31/028 (2013.01); *H02M 3/157* (2013.01); *H02M 3/1584* (2013.01); *H02M 2001/0009* (2013.01); *H02M 2001/0025* (2013.01); *H02M 2003/1586* (2013.01)

(58) Field of Classification Search
CPC .... H02M 3/158; H02M 3/1582; H02M 3/156; H02M 3/155; H02M 3/157; H02M 2001/0012; H02M 3/1563
USPC .......................................... 323/271, 282–285
See application file for complete search history.

(56) References Cited

U.S. PATENT DOCUMENTS

| 8,854,026 B2 * | 10/2014 | Karlsson | H02M 3/157 323/283 |
| 2010/0127682 A1 * | 5/2010 | Kenly | H02M 3/1588 323/282 |
| 2011/0148372 A1 * | 6/2011 | Mariani | H02M 3/156 323/272 |
| 2012/0223692 A1 * | 9/2012 | Prodic | H02M 3/1584 323/283 |
| 2014/0043008 A1 * | 2/2014 | Babazadeh | G05F 3/02 323/304 |
| 2016/0156262 A1 * | 6/2016 | Kelly | G05B 13/044 323/285 |

* cited by examiner

*Primary Examiner* — Nguyen Tran
(74) *Attorney, Agent, or Firm* — Chapin IP Law, LLC

(57) ABSTRACT

Controller circuitry controls power supply circuitry to produce an output voltage. During operation of the power supply circuitry to produce the output voltage, the controller circuitry calculates a magnitude of capacitance of output capacitor circuitry in the power supply. According to one configuration, the controller circuitry utilizes a calculated magnitude of capacitance as a basis to adjust settings of the power supply circuitry.

43 Claims, 15 Drawing Sheets

FIG. 1

OUTPUT CAPACITANCE CALCULATION AND CONTROL IN A POWER SUPPLY

BACKGROUND

Conventional voltage regulators typically include a bank of one or more output capacitors to store energy to store an output voltage that is produced to power a load. In general, as is well known, the inclusion of the bank of one or more output capacitors in a power supply helps to stabilize the output voltage. For example, the output capacitors can perform functions such as reduce unwanted ripple voltage; quickly source current during transient conditions when a respective load instantaneously consumes more current; quickly sink current during transient conditions when a respective load instantaneously consumes less current; and so on.

Unfortunately, the amount of capacitance associated with respective output capacitors of a power supply circuitry can vary over time. For example, effects of aging can reduce the ability of the output capacitors to store energy and therefore reduce its overall capacitance. Additionally, capacitors may be added or removed from an output capacitor bank of a power supply, causing the output capacitance of the power supply circuitry to change. Moreover, in certain instances, a precise capacitance of an output capacitor bank may not be known due to capacitor part variations from one part to another.

BRIEF DESCRIPTION

As discussed above, at any instant in time, the amount of capacitance associated with a bank of capacitors may not be known for a number of different reasons.

Embodiments herein include novel controller circuitry operable to calculate an output capacitance of a power supply circuitry. In one embodiment, the calculated output capacitance can be used to advantageously tune power supply circuitry, improving power supply performance parameters (such as stability, transient response, etc.).

More specifically, embodiments herein include controller circuitry. The controller circuitry controls corresponding power supply circuitry to produce an output voltage; the power supply circuitry includes output capacitor circuitry to store the output voltage outputted from an output port of the power supply circuitry. During operation of generating the output voltage, the controller circuitry further calculates a magnitude of capacitance of the output capacitor circuitry.

As further discussed below, the controller circuitry can be configured to calculate the output capacitance of respective one or more output capacitors based on measurement of variations in the output voltage and corresponding current consumption variations. Inducing the variations in the magnitude of the output voltage can be performed in any suitable manner. In one embodiment, the controller circuitry produces the variations in the magnitude of the output voltage during conditions in which a respective load powered by the output voltage consumes a relatively low amount of current.

Measurements of the output capacitance can be used for any suitable purpose. In accordance with further embodiments, the controller circuitry utilizes the magnitude of capacitance as a basis to adjust settings of power supply circuitry. The power supply circuitry can be any suitable type of power supply. In one specific embodiment, the power supply circuitry is a single phase of a multiphase DC/DC buck converter.

In accordance with yet further embodiments, the power supply circuitry controlled by a respective control circuitry can include a PID controller. The controller circuitry modifies gain settings of the PID controller of the power supply circuitry in response to detecting a change in the magnitude of the capacitance of the output capacitor circuitry over time.

The PID controller can be configured to include a first gain stage, a second gain stage, and a third gain stage. The first gain stage is disposed in a Proportional-signal path of the PID controller; the second gain stage is disposed in an Integrator-signal path of the PID controller, the third gain stage is disposed in a Derivative-signal path of the PID controller. The controller circuitry modifies one or more magnitude settings of the first gain stage (in the Proportional-signal path), second gain stage (in the Integrator-signal path), and/or the third gain stage (in the Derivative-signal path) to account for the change in magnitude of the capacitance of the output capacitor circuitry.

Adjusting one or more gain settings of the PID circuitry may improve power supply performance parameters such as stability, transient response, etc.). In one embodiment, as previously discussed, the power supply circuitry is a DC/DC converter. In such an instance, the power supply circuitry receives and converts a DC input voltage into a respective DC output voltage.

The control circuitry can be configured to repeatedly calculate the magnitude of the capacitance of the output capacitor circuitry at multiple instances over time (such as specified scheduled times). In response to detecting a change in the magnitude of the capacitance of the output capacitor circuitry based on the repeated calculations, the control circuitry updates the settings of the power supply circuitry as previously discussed. Accordingly, in one embodiment, the controller circuitry can ensure that the power supply circuitry is operating efficiently over time, even during conditions in which the output capacitance of the power supply circuitry changes.

Embodiments herein include multiple different ways of estimating an output capacitance of a power supply circuitry. For example, in one embodiment, the controller circuitry measures variations in generated output current while varying a magnitude of the output voltage. The controller circuitry uses the detected changes in magnitude of the output voltage and measured variations in output current associated with the output voltage to derive the value of the output capacitance.

More specifically, in a first set of embodiments, the controller circuitry initiates ramping the magnitude of the output voltage from a first voltage to a second voltage. In one embodiment, the ramp is generated by the controller circuitry in response to a dynamic load (such as a CPU or Central Processing Unit) requesting to change the voltage level of the output voltage for more efficient operation. This is called dynamic voltage transitioning. During ramping from the first voltage to the second voltage, the controller circuitry measures supplemental current supplied from a power source to ramp the magnitude of the output voltage from the first voltage to the second voltage. In such an example embodiment, the measured supplemental current supplied from the power source represents current charging the output capacitor circuitry of the power supply circuitry to change the voltage of output capacitor circuitry from the first voltage to the second voltage. The controller circuitry then uses the measured supplemental current supplied from the power source during the ramping to derive the magnitude of the capacitance of the output capacitor circuitry.

Thus, according to this first embodiment, while powering a respective load, the controller circuitry can be configured to: obtain a current value indicative of an amount of current supplied through a path of the power supply circuitry to charge the output capacitor circuitry; retrieve a slew rate value based on a change in the magnitude of the output voltage over time; and divide the current value by the slew rate value to estimate the magnitude of the output capacitor circuitry.

According to a second set of embodiments, the controller circuitry inputs or injects a test signal into a feedback control loop (such as error voltage, duty cycle, etc.) of the power supply circuitry regulating the output voltage at a desired voltage set point. In one embodiment, the controller circuitry generates the test signal to be at a base frequency that is substantially less than a switching frequency of respective switch circuitry in the power supply circuitry that generates the output voltage. At such low frequencies, the impedance of the output capacitor circuitry is predominantly capacitance.

Injection of the test signal causes the output voltage to include a supplemental AC voltage with respect to a DC voltage component present in the output voltage to power a load. The controller circuitry calculates the magnitude of the capacitance of the output capacitor circuitry based on: i) a measured magnitude of the supplemental AC voltage present on the output voltage, and ii) a measured magnitude of the supplemental AC current passing through the path of the power supply circuitry that produces the output voltage. In one embodiment, measuring as few as one sample per cycle is sufficient to determine a capacitance of the output capacitor circuitry.

In accordance with another embodiment, the controller circuitry: obtains a first value representing a peak-to-peak voltage measurement of the supplemental AC voltage; obtains a second value representing a peak-to-peak measurement of the supplemental AC current; and divides the second value (such as Ipp) by the first value (such as Vpp) to produce a third value (such as admittance, Y) that is proportional to the magnitude of capacitance of the output capacitor circuitry.

These and other more specific embodiments are disclosed in more detail below.

The embodiments as described herein are advantageous over conventional techniques. For example, the embodiments as discussed herein are applicable to switching voltage regulators with a buck topology for application to low voltage processors, memory, digital ASICs, etc. The concepts disclosed herein, however, are applicable to other suitable topologies such as boost regulators, buck-boost regulators, etc. The concepts disclosed herein, are applicable to other suitable non-power supply circuitry in which it is desirable to know an amount of capacitance associated with output capacitor circuitry.

Note that embodiments herein can include a controller configuration of one or more processor devices to carry out and/or support any or all of the method operations disclosed herein. In other words, one or more computerized devices or processors can be programmed and/or configured to operate as explained herein to carry out different embodiments of the invention.

Yet other embodiments herein include software programs to perform the steps and operations summarized above and disclosed in detail below. One such embodiment comprises a computer program product that has non-transitory computer-storage media (e.g., memory, disk, flash, . . . ) including computer program logic encoded thereon that, when performed in a computerized device having a processor and corresponding memory, programs the processor to perform the operations disclosed herein. Such arrangements are typically provided as software, code and/or other data (e.g., data structures) arranged or encoded on a computer readable storage medium or non-transitory computer readable media such as an optical medium (e.g., CD-ROM), floppy or hard disk or other a medium such as firmware or microcode in one or more ROM or RAM or PROM chips, an Application Specific Integrated Circuit (ASIC), etc. The software or firmware or other such configurations can be installed onto a controller to cause the controller to perform the techniques explained herein.

Accordingly, one particular embodiment of the present disclosure is directed to a computer program product that includes a computer readable medium having instructions stored thereon for supporting operations such as controlling phases in a power supply. For example, in one embodiment, the instructions, when carried out by a computer processor hardware, causes the computer processor hardware in a controller resource to: control power supply circuitry to produce an output voltage, the power supply circuit including output capacitor circuitry to store the output voltage outputted from an output of the power supply circuitry; and during operation of the power supply circuitry to produce the output voltage, calculate a magnitude of capacitance of the output capacitor circuitry.

The ordering of the steps has been added for clarity sake. These steps can be performed in any suitable order.

It is to be understood that the system, method, device, apparatus, etc., as discussed herein can be embodied strictly as hardware, as a hybrid of software and hardware, or as software alone such as within a processor, or within an operating system or a within a software application.

Note that although each of the different features, techniques, configurations, etc., herein may be discussed in different places of this disclosure, it is intended, where appropriate, that each of the concepts can optionally be executed independently of each other or in combination with each other. Accordingly, the one or more present inventions as described herein can be embodied and viewed in many different ways.

Also, note that this preliminary discussion of embodiments herein purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section and corresponding figures of the present disclosure as further discussed below.

BRIEF DESCRIPTION OF THE DRAWINGS

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

Figure 1:
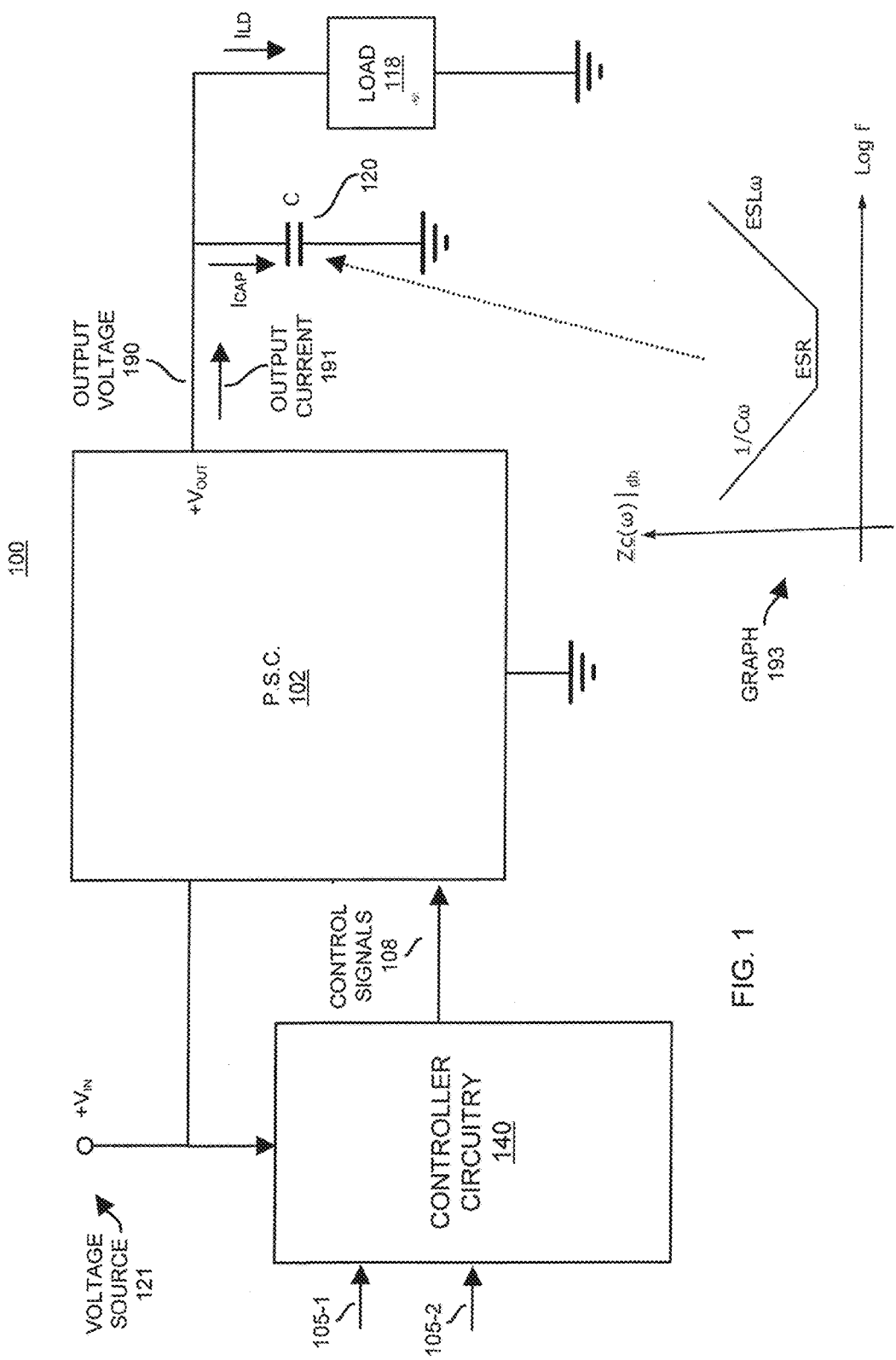
FIG. 1 is an example diagram of power supply circuitry including controller circuitry according to embodiments herein.

Now, more specifically, FIG. 1 is an example diagram of a power supply 100 according to embodiments herein.

As shown, the power supply 100 includes controller circuitry 140. As its name suggests, controller circuitry 140 controls an operation of power supply circuitry 102 and converts the input voltage (received from voltage source 121), VIN, into output voltage 190 based at least in part on one or more control functions.

As further shown, output voltage 190 powers load 118.

According to further embodiments, in addition to receiving the input voltage, controller circuitry 140 receives feedback 105 (feedback 105-1 such as Vout, feedback 105-2 such as a magnitude of output current 191, etc.).

The controller circuitry 140 uses one or more feedback signals from feedback 105 to produce control signals 108 that, in turn, control operation of power supply circuitry 102 and generation of the output voltage 190.

In one embodiment, the power supply circuitry 102 is a DC/DC buck converter. However, note that the power supply circuitry 102 can be any suitable type of power converter.

As further shown, power supply 100 includes output capacitor circuitry 120 (C) such as one or more capacitors.

Presence of the output capacitor circuitry 120 helps to stabilize the output voltage 190.

For example, during transient conditions when the corresponding load 118 instantaneously consumes additional current, the output capacitor circuitry 120 is able to immediately discharge current to satisfy the extra current consumption by the load 118. Conversely, when the corresponding load 118 instantaneously consumes less current, the capacitor circuitry 120 is able to immediately store excess current produced by the power supply circuitry 102 that is not consumed by the load 118. Eventually, the power supply circuitry 102 adjusts to the transient condition and is able to provide the appropriate current to maintain the output voltage 190 at a desired magnitude.

Graph 193 indicates how impedance characteristics of the output capacitor circuitry 120 vary depending upon an operating frequency. For example, as shown, at lower frequencies of a frequency spectrum, the impedance of the coupling capacitor circuitry 120 is mostly capacitive in nature as opposed to being resistive or inductive.

In accordance with one embodiment, during operation of controlling the power supply circuitry 102 to produce the output voltage 190, the controller circuitry 140 monitors attributes of the power supply circuitry 102 and calculates a magnitude of capacitance of the output capacitor circuitry 120.

As further discussed below, the calculation of the magnitude of capacitance associated with the output capacitor circuitry 120 can be used for any suitable purpose such as to modify control settings of the power supply 100. In accordance with further embodiments, the detected variations of the output capacitance of the output capacitor circuitry 120 may indicate a failure condition that needs to be addressed.

Control circuitry 140 can include analog circuitry, digital circuitry, or a combination of both. Note that the controller circuitry 140 can be or include a computer, processor, micro-controller, digital signal processor, etc., configured to carry out and/or support any or all of the method operations disclosed herein. In other words, the controller circuitry 140 can be configured to include one or more computerized devices, processors, digital signal processor, etc. to operate as explained herein to carry out different embodiments of the invention.

Note that embodiments herein can further include one or more software programs, executable code stored on a computer readable media to perform the steps and operations summarized above and disclosed in detail below. For example, one such embodiment comprises a computer program product that has a computer-storage medium (e.g., a non-transitory computer readable medium or media) including computer program logic (e.g., software, firmware, instructions, . . . ) encoded thereon that, when performed in the controller circuitry 140 having a processor and corresponding storage, programs the controller circuitry 140 to digitally perform the operations as disclosed herein. Such arrangements can be implemented as software, code, and/or other data (e.g., data structures) arranged or encoded on a computer readable medium such as an optical medium (e.g., CD-ROM), floppy or hard disk or other a medium such as firmware or microcode in one or more ROM or RAM or PROM chips, an Application Specific Integrated Circuit (ASIC), etc. The software or firmware or other such configurations can be stored in or may be accessible to the controller circuitry 140 to cause the controller 140 to perform the techniques explained herein.

Accordingly, in addition to hardware and/or firmware, one embodiment of the present disclosure is directed to a computer program product that includes a non-transitory computer readable medium (e.g., memory, storage repository, optical disk, integrated circuit, etc.).

Figure 2:
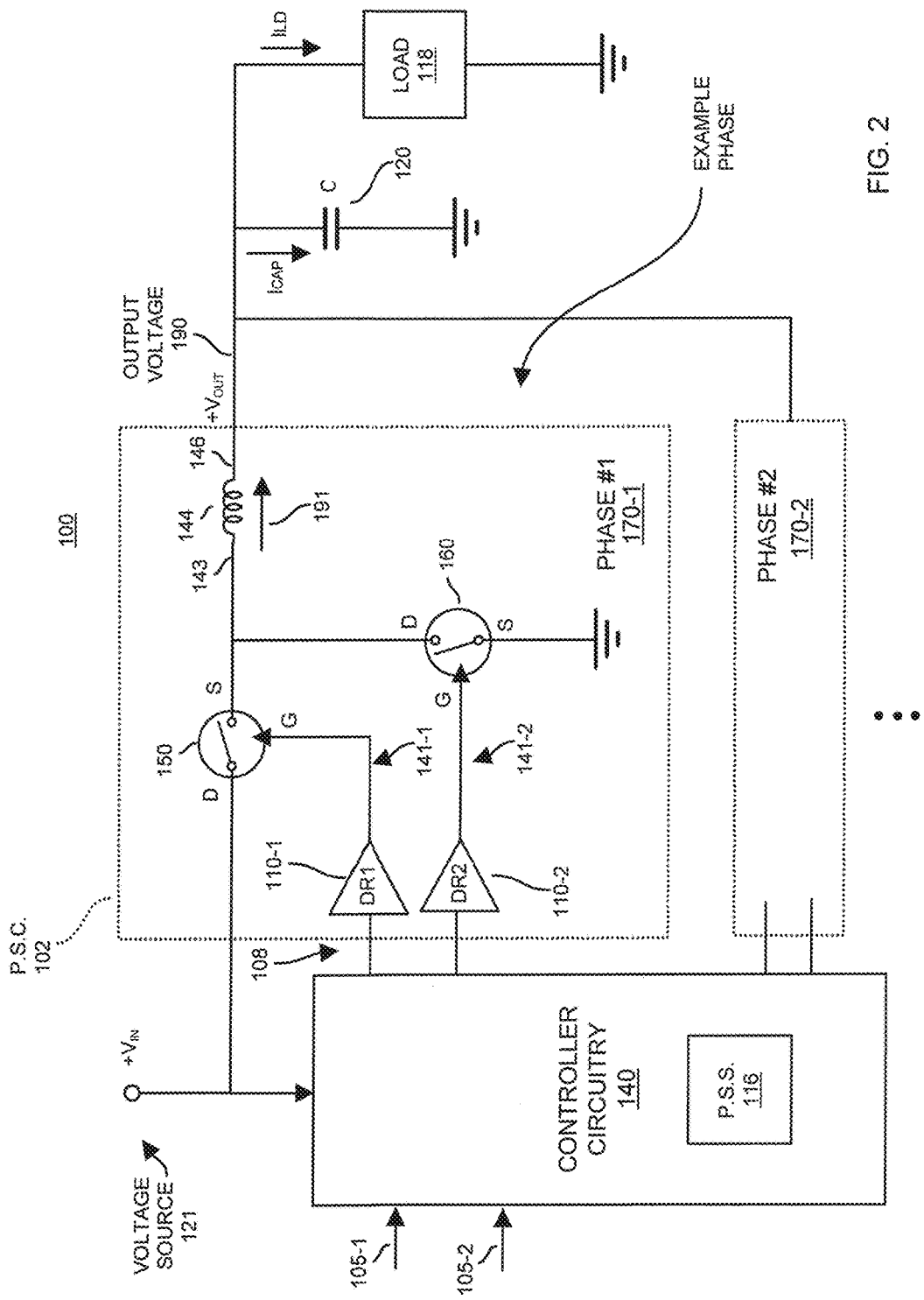
FIG. 2 is an example diagram illustrating a power supply including control circuitry according to embodiments herein.

FIG. 2 is an example diagram of a power supply circuit according to embodiments herein.

As shown, based on the received feedback 105 (i.e., inputs as previously discussed) and configuration settings (power supply settings information 116), controller circuitry 140 produces and outputs control signals 108 to switch the high side switch circuitry 150 and low side switch circuitry 160 to respective ON/OFF states when the phase 170-1 (of multiple phases) is activated.

In one embodiment, the high side switch circuitry 150 includes first field effect transistor circuitry, bipolar junction transistor circuitry, etc. Low side switch circuitry 160 includes second field effect transistor circuitry, bipolar junction transistor circuitry, etc. The switch circuitry can be any circuitry that withstands a sufficient amount of current and/or voltage and that may be controlled in order to deliver a desired amount of power to load 118. By way of non-limiting example, the switch circuitry can include any of one or more vertical or horizontal power switches (coolMos, HexFet), normally OFF (typical FET circuitry), etc.

Switching operation of high side switch circuitry 150 and low side switch circuitry 160 via control signals 108 converts DC input voltage VIN at voltage source 121 into output voltage 190 to power load 118.

In one embodiment, the controller circuitry 140 generates signals controlling the driver circuits 110-1 and 110-2. Based on control signals 108 received from the controller circuitry 140, driver 110-1 controls a state of high side switch circuitry 150 (e.g., control switch circuitry) and driver 110-2 controls a state of low side switch circuitry 160 (e.g., a synchronous switch circuitry) in power supply 100.

Note that driver circuits 110 (e.g., driver circuit 110-1 and driver circuit 110-2) can be located in the controller circuitry 140 or can reside at a remote location with respect to the controller circuitry 140.

When high side switch circuitry 150 is turned ON (i.e., activated) via control signals generated by controller circuitry 140 (while the low side circuitry 160 or synchronous switch is OFF), the current through inductor 144 (i.e., an energy storage element) increases via a highly conductive electrical path provided by high side switch circuitry 150 between voltage source 121 and the input node 143 of inductor 144.

When low side switch circuitry 160 is turned ON (i.e., activated) via control signals generated by controller circuitry 140 (while the high side switch circuitry 150 or control switch is OFF), the current through inductor 144 decreases based on an electrically conductive electrical path provided by the low side switch circuitry 160 between the input node 143 of the inductor 144 and ground as shown.

Based on proper switching of the high side switch circuitry 150 and the low side switch circuitry 160, the controller 140 regulates the output voltage 190 (at the output node 146 of the inductor 144) within a desired range to power load 118.

In one embodiment, power supply 100 includes multiple phases as shown. Each of the multiple phases can be similar to the example phase 170-1 shown in FIG. 1. During heavier load 118 conditions, the controller 140 initiates activation of multiple phases. During lighter load 118 conditions, the controller activates fewer phases such as a single phase 170-1. As previously discussed, the controller 100 activates the one or more phases to maintain the output voltage 190 within a desired range to power load 118.

As shown, each phase can include respective high side switch circuitry and low side switch circuitry as previously discussed. To deactivate a respective phase, the phase controller 140 can set both high side switch circuitry and low side switch circuitry of the respective phase to an OFF state. When off or deactivated, the respective phase does not contribute to producing output voltage 190 to power the load 118.

In accordance with further embodiments, the controller 140 can select how many phases to activate depending on an amount of current consumed by the load 118. For example, when the load 118 consumes a relatively large amount of current, the controller 100 can activate multiple phases to power the load 118. When the load 118 consumes a relatively small amount of current, the controller 140 can activate fewer or a single phase to power the load 118.

The phases can be operated out of phase with respect to each other.

As previously discussed, one embodiment herein includes calculating a respective capacitance of output capacitor circuitry 120. As further discussed herein, the controller circuitry 140 can be configured to receive feedback 105-1 to monitor a magnitude of the output voltage 190; the controller circuitry 140 can be configured to receive feedback 105-2 to monitor a magnitude of output current 191 through inductor 144. Any of multiple different types of methods such as estimations or physical measurements (such as DCR, measurement of currents through resistor, etc.) can be implemented in the power supply circuitry 102 to detect an amount of current 191 provided by phase 170-1 to charge output capacitor circuitry 120 as well as power load 118. In accordance with yet further embodiments, integrated current sensing is another way of sensing a magnitude of current 191 through the inductor 144. In this approach, the low side FET current (current through low side switch circuitry 160) is obtained by a current mirror or by sensing Rdson voltage when the low side switch circuitry is in an ON state. In such an instance, an emulated version of the high side FET current is used. Another option of sensing current through the inductor is to monitor a voltage across both the high side switch circuitry and low side switch circuitry.

Figure 3:
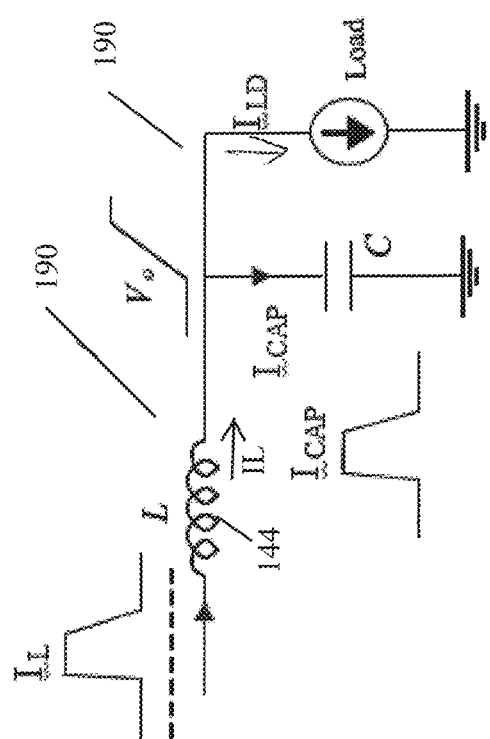
FIG. 3 is an example diagram illustrating ramping of an output voltage to measure output capacitance according to embodiments herein.

FIG. 3 is an example diagram illustrating ramping of an output voltage to measure output capacitance according to embodiments herein.

In this example embodiment, while the controller circuitry 140 controls power supply circuitry 102 to produce output voltage 190 and power load 118, the controller circuitry 140 initiates ramping of the output voltage from V1 to V2 to determine the magnitude of capacitance associated with the output capacitor circuitry 120.

As shown, load 118 consumes substantially constant current, $I_{LD}$, regardless of a magnitude of the output voltage between voltage V1 and V2. Ramping of the output voltage 190 from voltage V1 to voltage V2 causes the inductor current $I_L$ through inductor 144 to increase by an amount $I_{CAP}$ above steady state current $I_{LD}$ as further shown in FIG. 4. $I_{CAP}$ represents an amount of current to charge the respective output capacitor circuitry 120 during the ramping of the output voltage 190.

Figure 4:
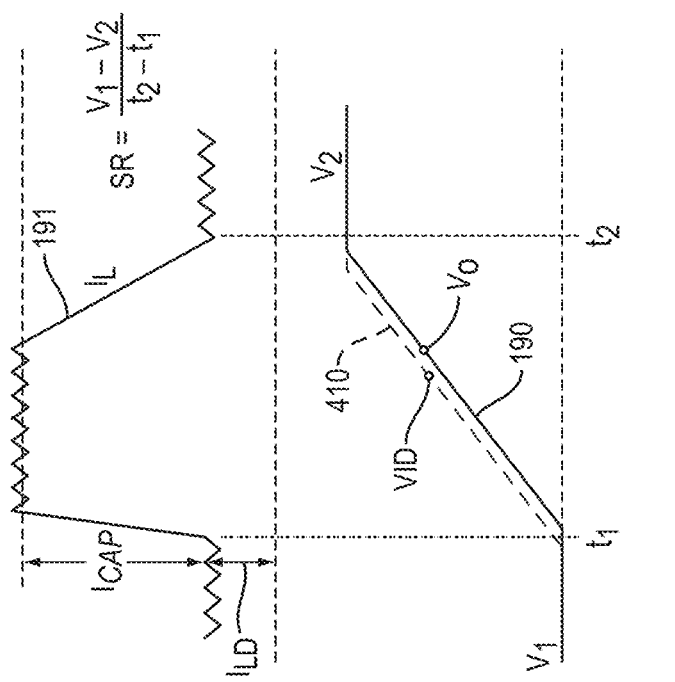
FIG. 4 is an example timing diagram illustrating a theoretical change in current resulting from ramping of the output voltage according to embodiments herein.

FIG. 4 is an example timing diagram illustrating a theoretical change in current resulting from ramping of the output voltage according to embodiments herein.

Assume in this example embodiment that the control circuitry 140 (such as generation of a VID control signal 410) initiates ramping of the output voltage 190 from voltage V1 to voltage V2 between time T1 and time T2. The VID control signal 410 specifies the desired setting of the output voltage 190 over time during the ramping.

The slew rate, SR or dV/dT, of ramping the output voltage in this example embodiment is equal to (V2−V1)/(t2−t1).

As previously discussed, the load current $I_{LD}$ consumed by the respective load 118 is substantially constant regardless of the magnitude of the output voltage 190 between voltage V1 and V2. During ramping of the output voltage from voltage V1 to V2, the controller circuitry 140 monitors feedback 105-2 to determine the amount of output current 191 (i.e., current $I_L$) through the inductor 144. The current $I_L$ is apportioned to supply current $I_{CAP}$ to the output capacitor circuitry 120 and current $I_{LD}$ to power the respective load 118

Note that the output current 191 can be measured in any suitable manner. For example, in one embodiment, the feedback 105 represents the voltage across node 143 and node 146 of the inductor 144. By way of non-limiting example embodiment, the controller circuitry 140 implements a suitable current sensing technique such as DCR current sensing (which uses parasitic resistance of the inductor 144 to determine current) across node 143 and node 146 of inductor 144 to detect the amount of current $I_L$ passing through the inductor 144 to output capacitor circuitry 120 and load 118. Note that any suitable current measuring technique such as DCR current sensing, measuring voltage across known resistor in path of the inductor 144, etc., can be used to measure the output current 191 through inductor 144 and corresponding path.

As further shown, and as previously discussed, during ramping of the output voltage from voltage V1 to V2, the output capacitor circuitry 120 consumes supplemental current $I_{CAP}$. The amount of output current $I_L$ through the inductor 144 is equal to the load current $I_{LD}$ plus the amount of current $I_{CAP}$ supplied to the output capacitor circuitry 120.

In other words, $I_L = I_{LD} + I_{CAP}$.

Thus, $I_{CAP} = I_L - I_{LD}$. $I_L$ is known via monitoring of feedback 105-2. $I_{LD}$ is known based on measuring consumption of current by load 118 prior to and up to time t1.

To determine the capacitance of output capacitor circuitry 120, the controller circuitry 140 divides $I_{CAP}$ by the slew rate, SR, as follows:

Capacitance=$I_{CAP}$/SR

Thus, in one embodiment, to measure the capacitance of output capacitor circuitry 120, the controller circuitry 140 initiates ramping the magnitude of the output voltage 190 from a first voltage V1 to a second voltage V2. During ramping from voltage V1 to voltage V2, the controller circuitry 140 calculates supplemental current, $I_{CAP}$, supplied from a power source (inductor 144) to ramp the magnitude of the output voltage 190 from the first voltage V1 to the second voltage V2. In such an example embodiment, the measured supplemental current, $I_{CAP}$, supplied from the inductor 144 represents current charging the output capacitor circuitry 120 of the power supply 100. As discussed above, the controller circuitry 144 then uses the estimated supplemental current, $I_{CAP}$, supplied from the power source during the ramping to derive the magnitude of the capacitance of the output capacitor circuitry 120.

Thus, according to one embodiment, the controller circuitry 140 can be configured to calculate the output capacitance of one or more respective output capacitors such as in output capacitor circuitry 120 based on output voltage variations and corresponding current consumption variations. For example, the controller circuitry 144 can be configured to: obtain a current value indicative of an amount of current $I_{CAP}$ supplied through a path (inductor 144) of the power supply circuitry 102 to charge the output capacitor circuitry 120; retrieve a slew rate value (SR) indicating a change in the magnitude of the output voltage over time between time t1 and time t2; and divide the current value ($I_{CAP}$) by the slew rate value (SR) to estimate the magnitude of capacitance associated with the output capacitor circuitry 120.

Thus, as described herein, the controller circuitry 140 can be configured to simultaneously: i) produce a respective output voltage 190 to power the load 118, and ii) ramp the output voltage 190 to induce generation of supplemental current, $I_{CAP}$, to charge the output capacitor circuitry 120.

As an illustrative example, assume that SR=20 mV/us, ICAP=40 Amperes. In such an instance, the controller circuitry 140 calculates C=40/20 mV/us=2 mF.

Note that the process of ramping the output voltage 190 to calculate the capacitance of the output capacitor circuitry 120 can be performed any suitable time (such as at regular time intervals, random times, triggered by entity such as user, etc.) during a life of the power supply 100 to detect changes in the output capacitance of power supply 100. In one embodiment, as previously discussed, the control circuitry 140 ramps the output voltage at times when the current consumed by the respective load is relatively low.

As further discussed below, note that ramping of the respective output voltage 190 to calculate a capacitance of output capacitor circuitry 120 is shown by way of non-limiting example only. In any suitable manner such as further discussed below, the controller circuitry 140 can be configured to initiate generation of a respective supplemental voltage and a measure of a supplemental current with respect to the output voltage 190 to calculate the output capacitance of output capacitor circuitry 120.

Figure 5:
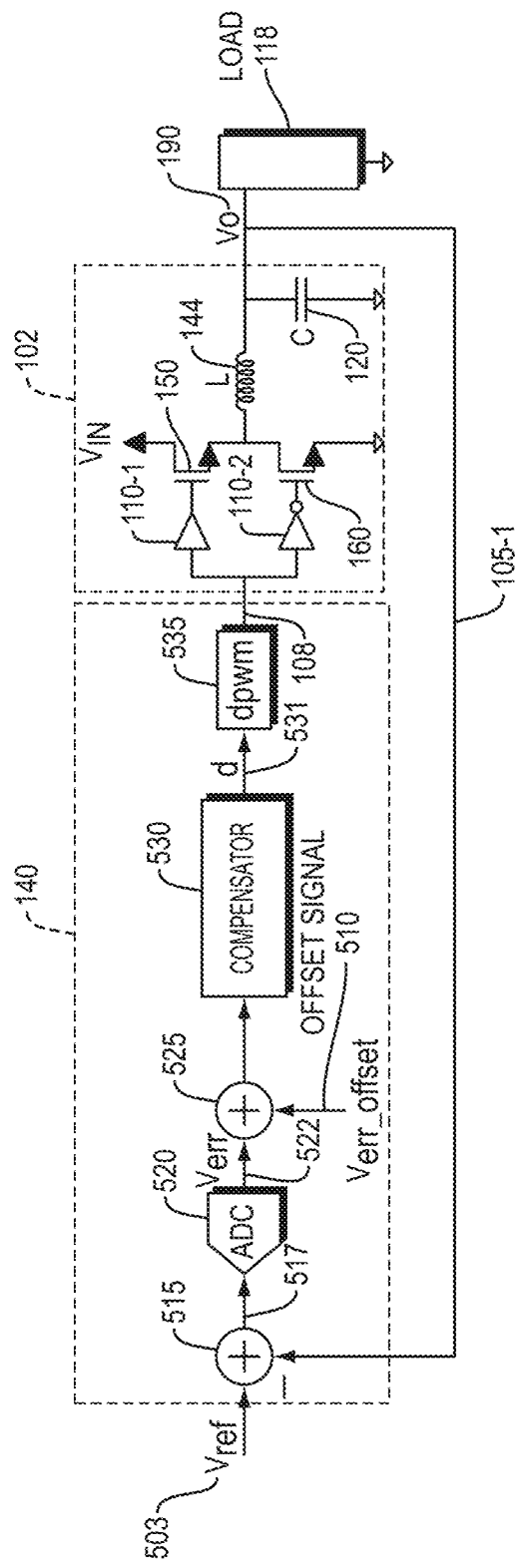
FIG. 5 is an example diagram illustrating modification of an error voltage with an offset signal to induce generation of a supplemental AC voltage and AC current with respect to an output voltage according to embodiments herein.
Figure 6:
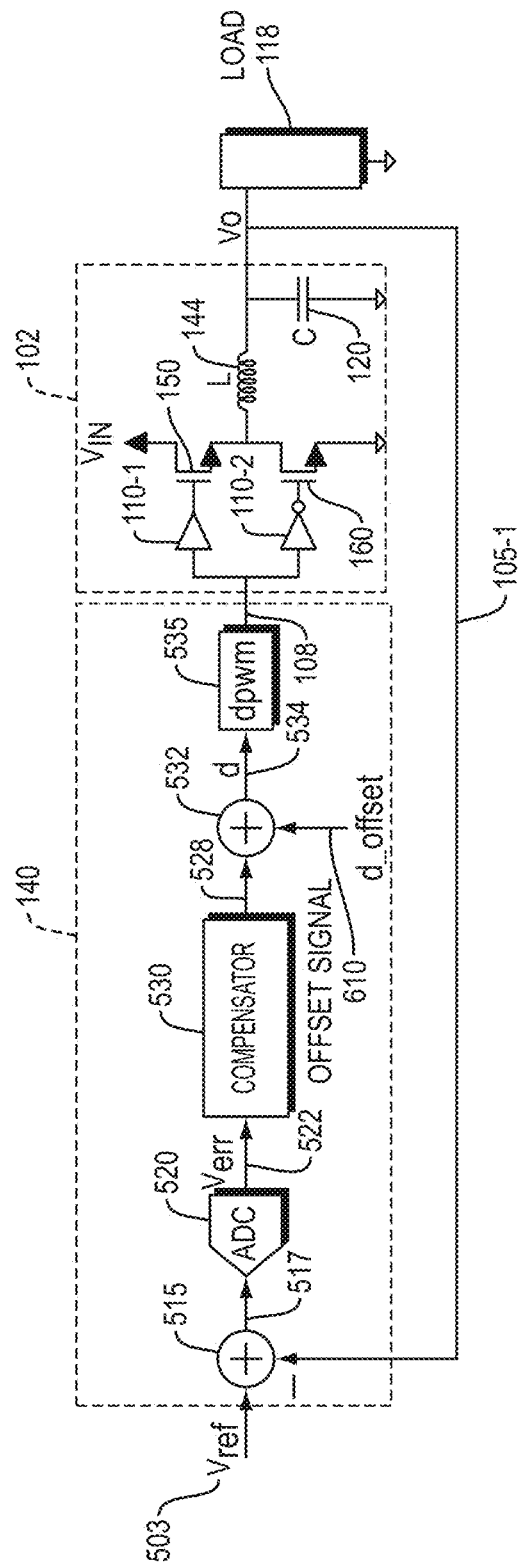
FIG. 6 is an example diagram illustrating modification of a duty cycle with an offset signal to induce generation of a supplemental AC voltage and supplemental AC current with respect to an output voltage according to embodiments herein.

According to further embodiments shown in FIGS. 5 and 6, to produce a perturbation on the output voltage 190 including supplemental AC voltage, which results in a supplemental AC current through the inductor 144, the controller circuitry 140 can be configured to input or inject a test signal into a feedback control loop (such as error voltage, duty cycle, etc.) of the controller circuitry 140 that regulates the output voltage at a desired voltage set point.

In one embodiment, the controller circuitry 140 generates the test signal (such as offset signal 510 or offset signal 610) to be at a base frequency (such as below 1000 Hz) that is substantially less than a switching frequency (such as greater than 100,000 Hz) of respective switch circuitry (such as high side switch circuitry 150 and low side switch circuitry 160) in the power supply circuitry 102 that generates the output voltage 190.

As further discussed below, injection of the test signal causes a measurable perturbation in a magnitude of the output voltage 190. The perturbation in the magnitude of the output voltage 190 causes the inductor 144 to supply supplemental current to charge the output capacitor circuitry 120.

In one embodiment, the perturbation induced by injection of the test signal causes the output voltage to include a supplemental AC voltage with respect to a DC voltage component present in the output voltage 190 to power a load 118. The controller circuitry 140 calculates the magnitude of the capacitance of the output capacitor circuitry based at least in part on: i) a measured magnitude of the supplemental AC voltage present on the output voltage 190, and ii) a measured magnitude of supplemental AC current passing through the path such as the inductor 144 of the power supply circuitry 102 that produces the output voltage 190, the supplemental AC current charges the capacitor.

Now, more specifically, FIG. 5 is an example diagram illustrating modification of an error voltage to induce generation of a supplemental AC voltage and AC current with respect to an output voltage according to embodiments herein.

As shown, control circuitry 140 can be configured to include summer circuitry 515, analog-to-digital converter 520, summer circuitry 525, compensator circuitry 530, and PWM generator circuit 535.

During operation, based on a difference between the inputted reference voltage 503 and the feedback 105-1 (such as the output voltage 190), the summer circuitry 515 outputs an analog error voltage 517 to the analog-to-digital converter 520. The analog-to-digital converter 520 converts the received analog error voltage 517 into a digital error voltage signal 522. Summer circuitry 525 sums the digital error voltage signal 522 and the offset signal 510 (test signal) to produce a respective output sign up al 527 outputted to the compensator circuitry 530. As previously discussed, the offset signal 510 induces a perturbation on the output voltage 190.

Based on a sum of the digital error voltage 522 and the offset signal 510, the compensator circuitry 530 produces an output control signal 531 (d) indicating a duty cycle in which to operate the corresponding high side switch 150 and low side switch 160. Based on the duty cycle (d) as produced by the compensator circuitry 530, the pulse width modulation circuitry 535 produces one or more control signals 108 to control switching states of high side switch circuitry 150 and low side switch circuitry 160.

As previously discussed, the control circuitry 140 switches the high side switch 150 and low side switch 160 between respective ON and OFF states to maintain the output voltage 190 within a desired range. Presence of the offset signal 510 causes an AC perturbation to be present on the output voltage 190. Because the load 118 consumes a substantially constant amount of current even though the magnitude of the output voltage 190 may fluctuate, presence of the AC perturbation on the output voltage 190 causes a perturbation in current supplied by the inductor 144 to the output capacitor circuitry 120.

FIG. 6 is an example diagram illustrating modification of a duty cycle to induce generation of a supplemental AC voltage and supplemental AC current with respect to an output voltage according to embodiments herein.

As shown, control circuitry 140 can be configured to include summer circuitry 515, analog-to-digital converter 520, the compensator circuitry 530, summer circuitry 532, and PWM generator circuit 535.

During operation, based on a difference between the inputted reference voltage 503 and the feedback 105-1 (output voltage 190), the summer circuitry 515 outputs an analog error voltage 517 to the analog-to-digital converter 520. The analog-to-digital converter 520 converts the received analog error voltage 517 into a digital error voltage signal 522. The compensator circuitry 530 produces an output control signal 528 indicating a duty cycle in which to switch the corresponding high side switch circuitry 150 and low side switch circuitry 160. The summer circuitry 532 sums the output control signal 528 and the offset signal 610 to produce modified duty cycle signal 534. Based on the modified duty cycle signal 534, the pulse width modulation circuitry 535 produces control signals 108 to control switching states of high side switch circuitry 150 and low side switch circuitry 160.

As previously discussed, the controller circuitry 140 switches the high side switch circuitry 150 and low side switch circuitry 160 between respective ON and OFF states to maintain the output voltage 190 within a desired range. As further shown in the following figures, injection of the offset signal 610 causes an AC voltage perturbation to the magnitude of the output voltage 190. The AC voltage perturbation causes a perturbation to the amount of current outputted from the inductor 144.

Figure 7:
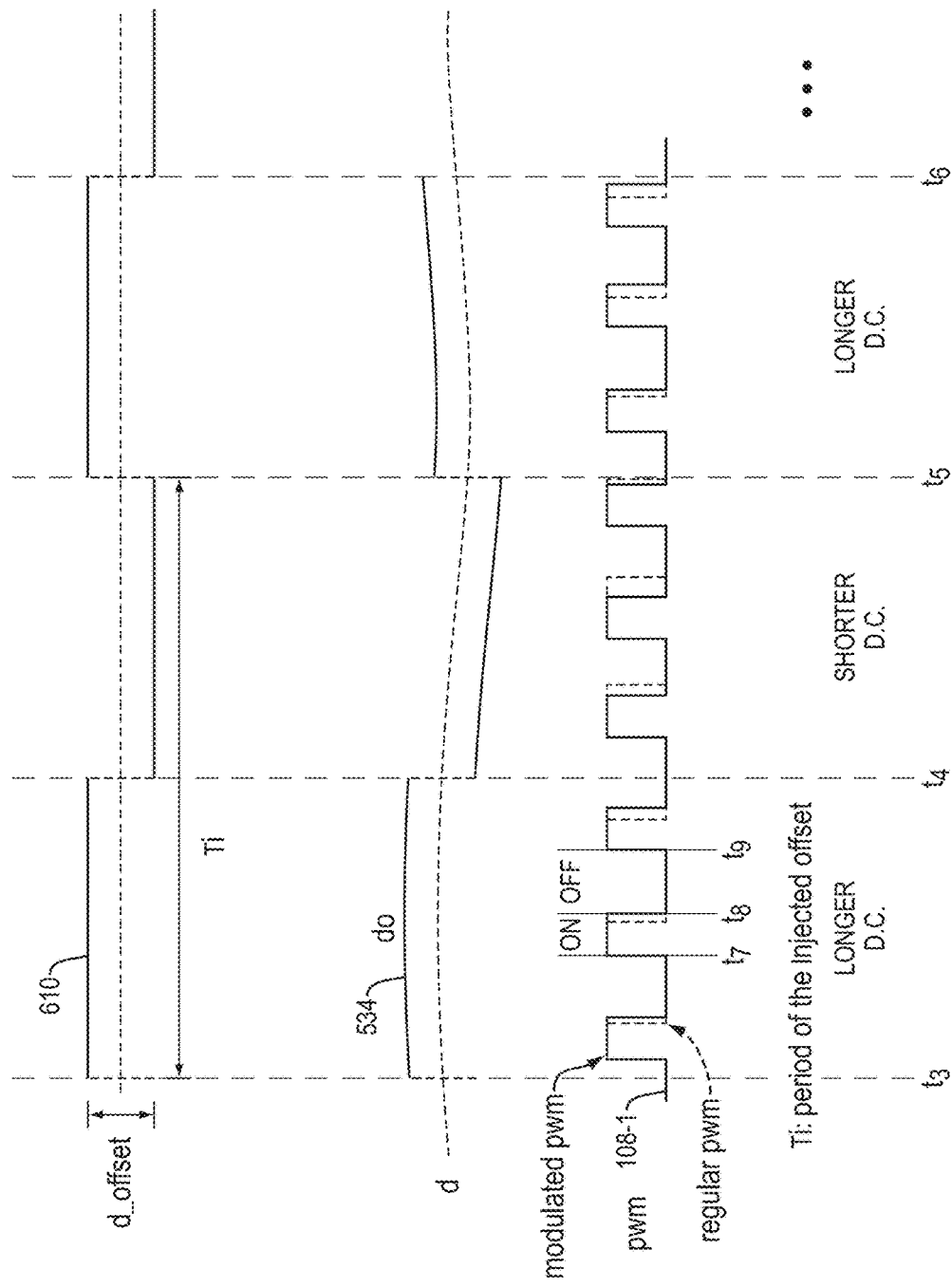
FIG. 7 is an example timing diagram illustrating modification of a duty cycle according to embodiments herein.

FIG. 7 is an example timing diagram illustrating modification of a duty cycle according to embodiments herein.

As previously discussed, summer circuitry 532 sums the offset signal 610 (i.e., injected test signal) and the output of compensator circuitry 530 to produce modified duty cycle signal 534. The frequency of the offset signal 610 is substantially less than a switching frequency of controlling the high side switch circuitry 150 and the low side switch circuitry 160 between ON and OFF states.

Note that the test signal (such as offset signal 510, office of signal 610, etc.) can be offset (rectangular), sinusoidal, or any type of periodic signal with dominant first harmonics at the test signal injection frequency. Higher harmonics of the test signal can be attenuated by the respective feedback loop.

Between time T3 and time T4 as shown, during a first half of a period of the offset signal 610, the offset signal 610 increases the duty cycle to be greater than the appropriate duty cycle that would normally be used (absent injection of the test signal) to control states of the high side switch circuitry 150 and low side switch circuitry 160.

Between time T4 and time T5 as shown, during a second half of the period of the offset signal 610, the offset signal 610 increases the modified duty cycle 534 to be less than the appropriate duty cycle that would normally be used (absent injection of the test signal) to control the high side switch 150 and low side switch 160.

In this manner, injection of the test signal (offset signal 610) causes positive and negative variations of the duty cycle. In other words, between time T3 in time T4, the original duty cycle is lengthened; between time T4 T5, the original duty cycle is shortened, and so on.

Note that when control signal 108-1 and is a logic one state, the respective driver circuitry 110-1 activates high side switch circuitry 150 to an ON state, while driver circuitry 110-2 controls low side switch 160 to an OFF state. Conversely, when control signal 108-1 is a logic zero state, the respective driver circuitry 110-1 controls high side switch circuitry 150 to an OFF state, while driver circuitry 110-2 controls low side switch circuitry 160 to an ON state.

Figure 8:
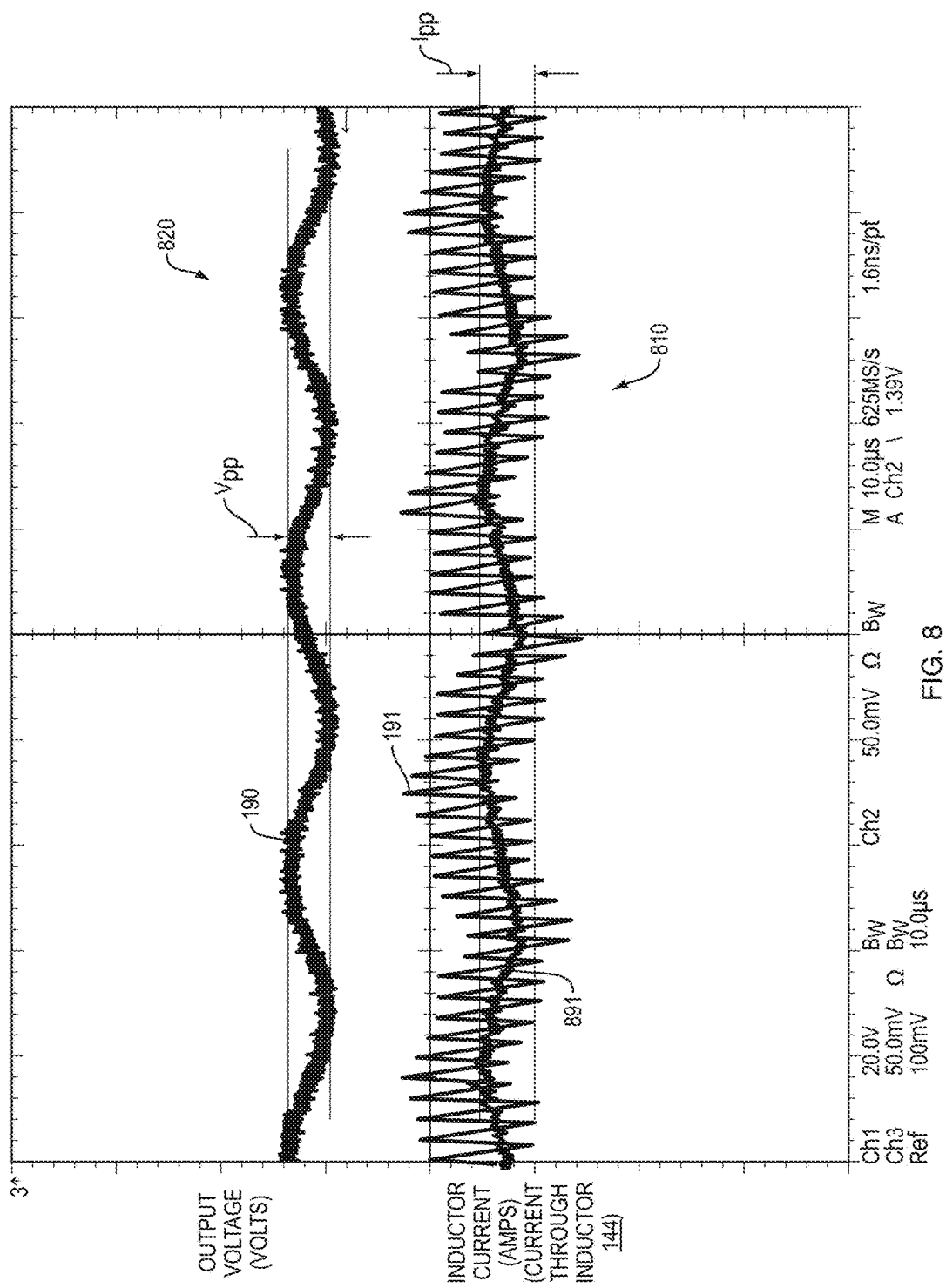
FIG. 8 is an example timing diagram illustrating generation of a supplemental AC voltage and supplemental AC current with respect to a generated output voltage according to embodiments herein.

The results of the positive and negative variations of the duty cycle controlling high side switch 150 and low side switch 160 is further shown in FIG. 8.

FIG. 8 is an example timing diagram illustrating generation of a supplemental AC voltage and supplemental AC current with respect to a generated output voltage according to embodiments herein.

Graph 820 indicates a change in the magnitude of the output voltage 190 over time. As shown, injection of the offset signal 610 (or offset signal 510) causes the magnitude of the output voltage 190 to vary. For example, as shown, modification of the duty cycle using the offset signal 610 induces a positive supplemental AC voltage with respect to the original output voltage 190 as a result of lengthening the duty cycle between time T3 and T4 (FIG. 7); the offset signal 610 causes negative supplemental AC voltage with respect to the original output voltage 190 as a result of shortening the duty cycle between times T4 and T5 (FIG. 7).

In one embodiment, the amplitude or magnitude of the offset signal is sufficiently low such that the variations of the duty cycle is less than +/−5%, resulting in low performance degradation of producing the output voltage 190. In accordance with further embodiments, note that the variations in the duty cycle can be less than +/−2%.

In the case of injecting the test signal (offset signal 510) to cause a perturbation, the voltage error offset can be +/− a few LSBs, such as +/−2 or +/−3 LSBs.

In the following cycles after T5, the magnitude of the current output 191 varies in a similar manner as a result of the injected offset signal 610 (or offset signal 510).

In this example embodiment, variations in the magnitude of the output voltage 190 cause variations in the magnitude of output current 191 (current though inductor) due to charging and discharging of the output capacitor circuitry 120 because the current consumed by the load 118 is substantially constant even though the magnitude of the output voltage 190 changes.

Graph 810 indicates a change in the magnitude of the output current 191 over time. As shown, modification of the duty cycle using the offset signal 610 causes a positive supplemental AC current to flow through the inductor 144 between time T3 and time T4 and a negative supplemental AC current to flow between time T4 and T5.

As previously discussed, note again that injection of offset signal 510 results in generation of a similar supplemental AC voltage with respect to the output voltage 190 as well as the supplemental AC current with respect to output current 191.

To derive a value of the output capacitance of the output capacitor circuitry 120, the control circuitry 140 monitors both the output current 191 and output voltage 190 while injecting the test signal (offset signal 510 or offset signal 610) into a respective feedback path of the power supply 100. In one embodiment, the controller circuitry 140 filters the measured output current 191 to produce average output current signal 891 (average current through inductor 144 without ripple voltage) as shown in graph 810.

As further shown, the controller circuitry 140 further measures peak-to-peak voltage, $V_{PP}$ (the test signal induced supplemental AC voltage), based upon the monitored output voltage signal 190. The controller circuitry 140 further measures peak-to-peak current, $I_{PP}$ (the test signal induced supplemental AC current), based upon the monitored output current signal 891 (represents average of output current 191 without ripple).

In accordance with further embodiments, the controller circuitry 140 utilizes the induced supplemental AC voltage and the induced supplemental AC current to determine the respective capacitance of output capacitor circuitry 120. For example, as previously discussed, the controller circuitry 140 obtains (via output voltage 190) a first value ($V_{PP}$) representing a peak-to-peak voltage measurement of the supplemental AC voltage. The controller circuitry 140 obtains (via monitoring output current 191) a second value ($I_{PP}$) representing a peak-to-peak current measurement of the supplemental AC current. The controller circuitry 140 divides Ipp by the Vpp to produce a third value (such as an admittance, Y, of the output capacitor circuitry 120 at the base frequency of the test signal) proportional to the magnitude of capacitance of the output capacitor circuitry 120. That is, admittance Y=Ipp/Vpp.

In one embodiment, $Y \sim C_2 * Pi * fi$, where Pi=3.14159, and where fi is the base frequency of the injected test signal (such as offset signal 510 or 610). In such an instance, the capacitance C=Y/(2*pi*fi)

If desired, the controller circuitry 140 can be configured to repeatedly inject the test signal or vary the magnitude of the output voltage 190 in order to perform multiple calculations of the capacitance of the output capacitor circuitry 120. In such an instance, the controller circuitry 140 averages the calculated values to produce an overall capacitor value indicative of the capacitance of the output capacitor circuitry 120.

Figure 9:
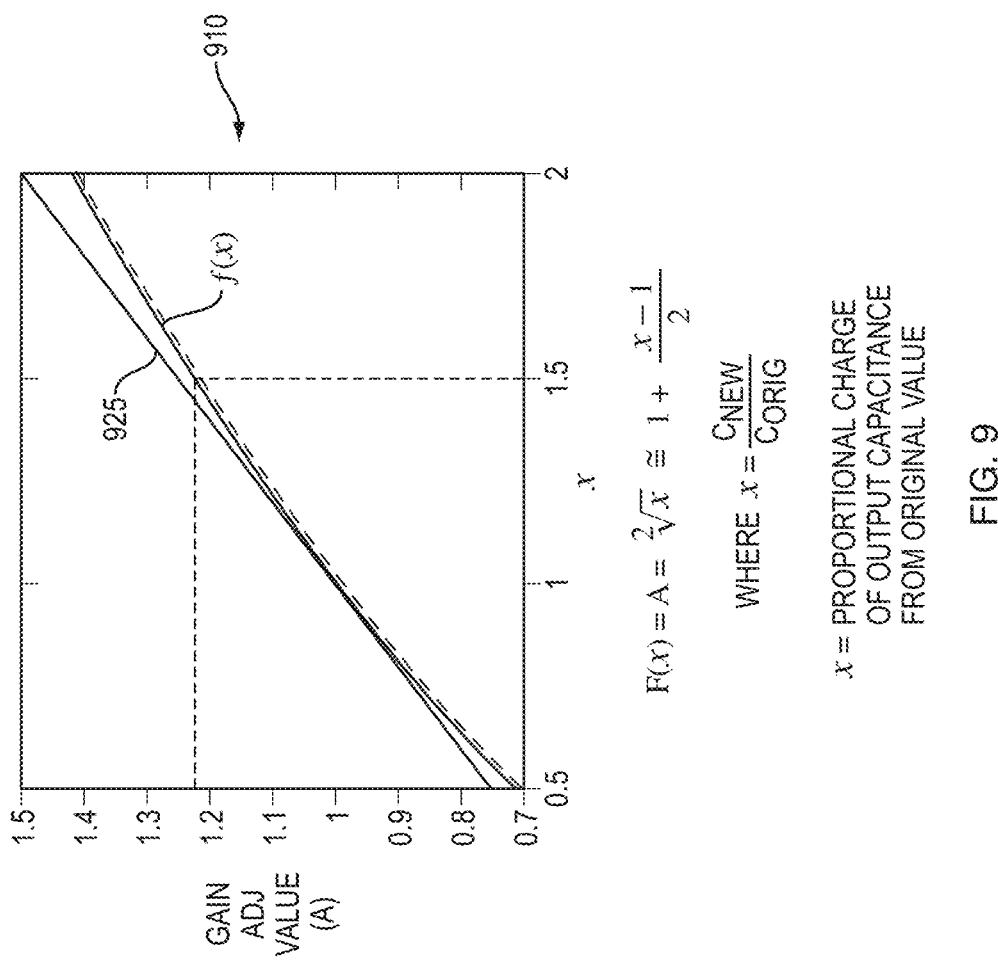
FIG. 9 is an example diagram illustrating a function to convert a detected change in output capacitance to an adjustment value according to embodiments herein.

FIG. 9 is an example diagram illustrating a function to produce a gain adjustment value according to embodiments herein.

In this example embodiment, the controller circuitry 140 performs the above analysis to determine the current capacitance ($C_{NEW}$) of the output capacitor circuitry 120. Assume that the original capacitance of the output capacitor circuitry 120 is represented by the value, $C_{ORIG}$.

To determine how to adjust one or more gain values based upon the change in capacitance, the controller circuitry 140 sets x=$C_{NEW}/C_{ORIG}$. In such an instance, the magnitude of x captures a degree and direction in which the capacitance of the output capacitor circuitry 120 has changed over time since the last reading, $C_{ORIG}$.

As shown, if there is no change in the capacitance associated with the output capacitor circuitry 120 (i.e., x=1), then the respective gain adjustment value A is set to unity or 1.

As a further example, assume that x=$C_{NEW}/C_{ORIG}$ is 1.5, in which the output capacitance of output capacitor circuitry 120 increases by 50% respect to the original reading. In such an instance, the controller circuitry 140 uses f(x) or linear approximation 925 in graph 910 to map the value of x=1.5 to a gain adjustment value A=1.25.

As a further example, assume that x=$C_{NEW}/C_{ORIG}$ is 0.5, in which the output capacitance of output capacitor circuitry 120 decreases by 50%. In such an instance, the controller circuitry 140 uses f(x) or linear approximation 925 to map the value of x=0.5 to a gain adjustment value A=0.75.

In one embodiment, the controller circuitry 140 accesses to a respective table lookup providing the linear approximation of converting ratio x=$C_{NEW}/C_{ORIG}$ to a corresponding gain adjustment value.

In this manner, the controller circuitry 140 generates gain adjustment values for any of one or more of gain adjustment values A1, A2, A3, etc., as further discussed below.

The control circuitry 140 stores the gain adjustment values as power supply settings 116.

Figure 10:
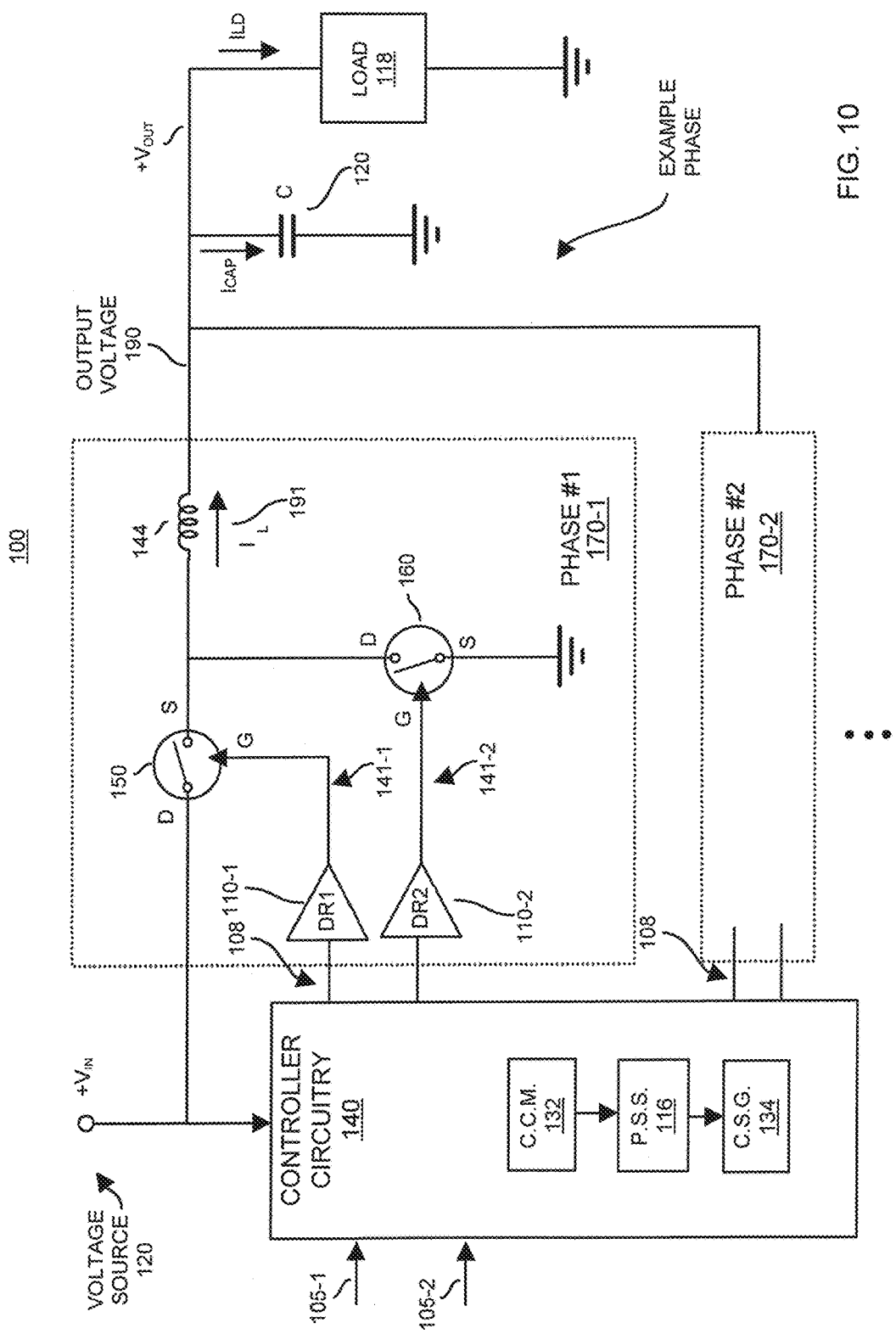
FIG. 10 is a diagram illustrating a more specific details of example controller circuitry according to embodiments herein.

FIG. 10 is a diagram illustrating more specific details of example controller circuitry according to embodiments herein.

As previously discussed, the controller circuitry 140 can be configured to keep track of the capacitance associated with output capacitor circuitry 120. In one embodiment, the control circuitry 140 includes control coefficient modifier 132 that generates the power supply settings 116 based upon the tracked capacitance of output capacitor circuitry 120. Control circuitry 140 includes control signal generator 134 to generate respective control signals 108.

Additional details of the control coefficient modifier 132 are further discussed below with respect to FIG. 11. Additional details of the control signal generator 134 are further discussed below with respect to FIG. 12.

Figure 11:
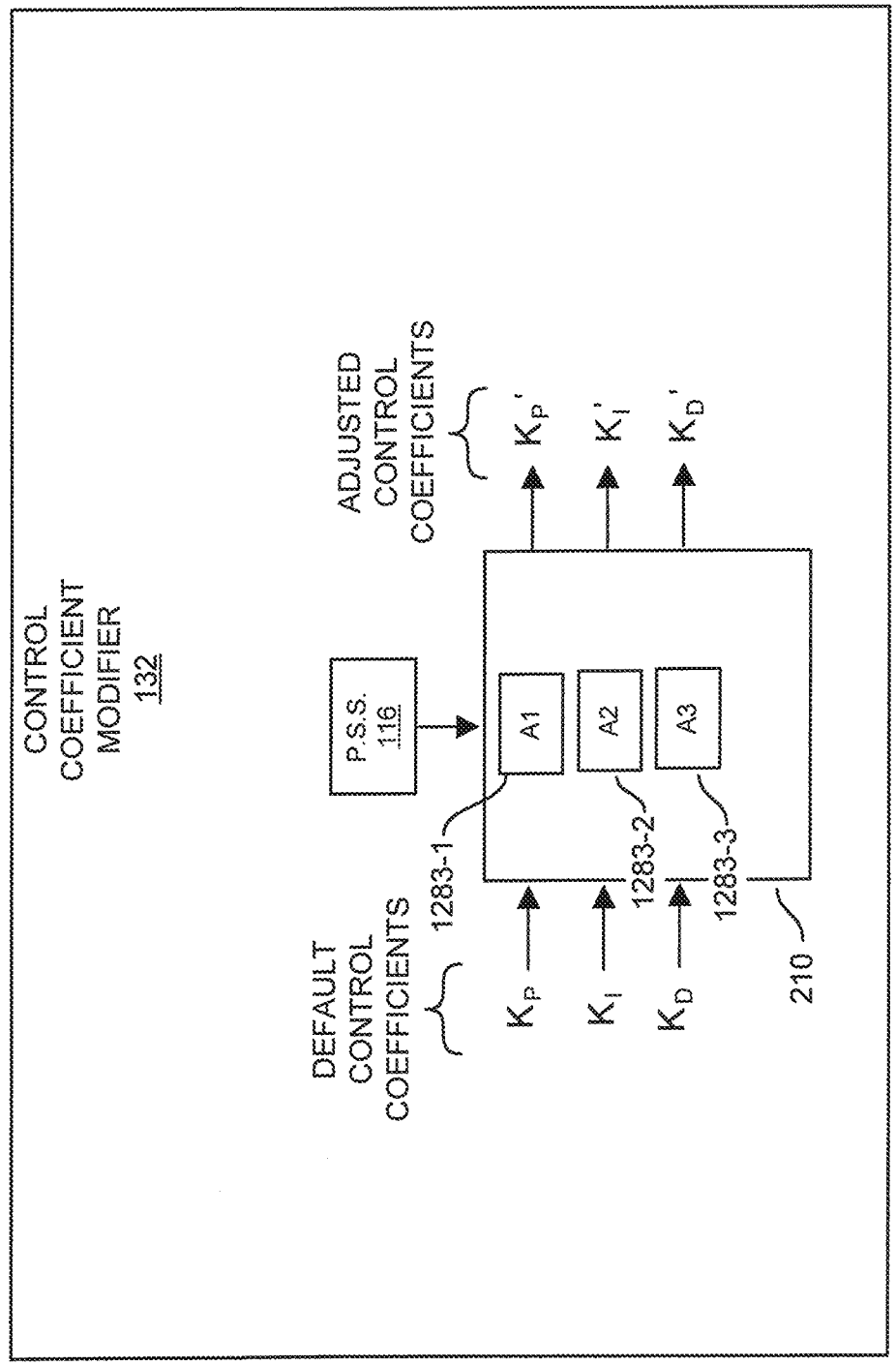
FIG. 11 is an example diagram illustrating a power supply setting adjustment circuit (control coefficient modifier) according to embodiments herein.

FIG. 11 is an example diagram illustrating a power supply setting adjustment circuit according to embodiments herein.

In a manner as previously discussed, the control circuitry 140 can be configured to generate the power supply settings 116 including A1, A2, and A3. In one embodiment, the controller circuitry 140 generates the power supply system 116 to include gain settings A1, A2, and A3 depending upon the calculation of the calculated capacitance of the output capacitor circuitry 120. The default value for each of Kp, Ki, and Kd can be the value 1.0. Any of one or more of the gain values A1, A2, and A3 can be adjusted to accommodate a change in capacitance such that the power supply 100 operates more efficiently.

As shown, the control coefficient modifier 132 uses the power supply settings 116 to modify default PID gain coefficients Kp, Ki, and Kd.

For example, in one embodiment, based on the power supply settings 116, control coefficient modifier 132 produces:
Kp'=A1*Kp
Ki'=A2*Ki
Kd'=A3*Kd These one or more gain adjusted coefficients (such as Kp', Ki'. And Kd') are used in following FIG. 12 to modify behavior of a respective PID control circuit implemented by the control circuitry 140 to produce the output voltage 190.

Figure 12:
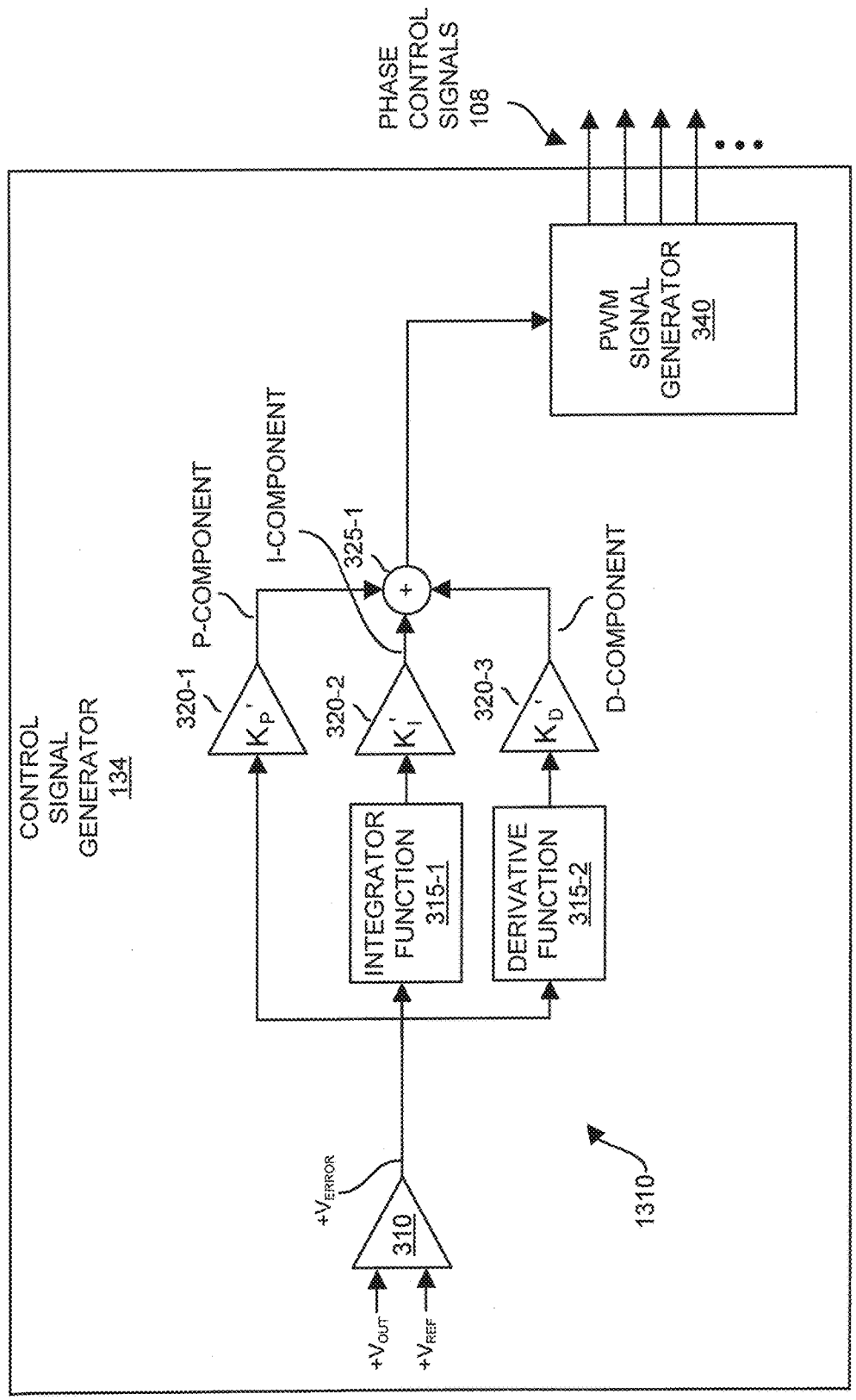
FIG. 12 is an example diagram illustrating modification of one or more gains in a PID circuit according to embodiments herein.
Figure 13:
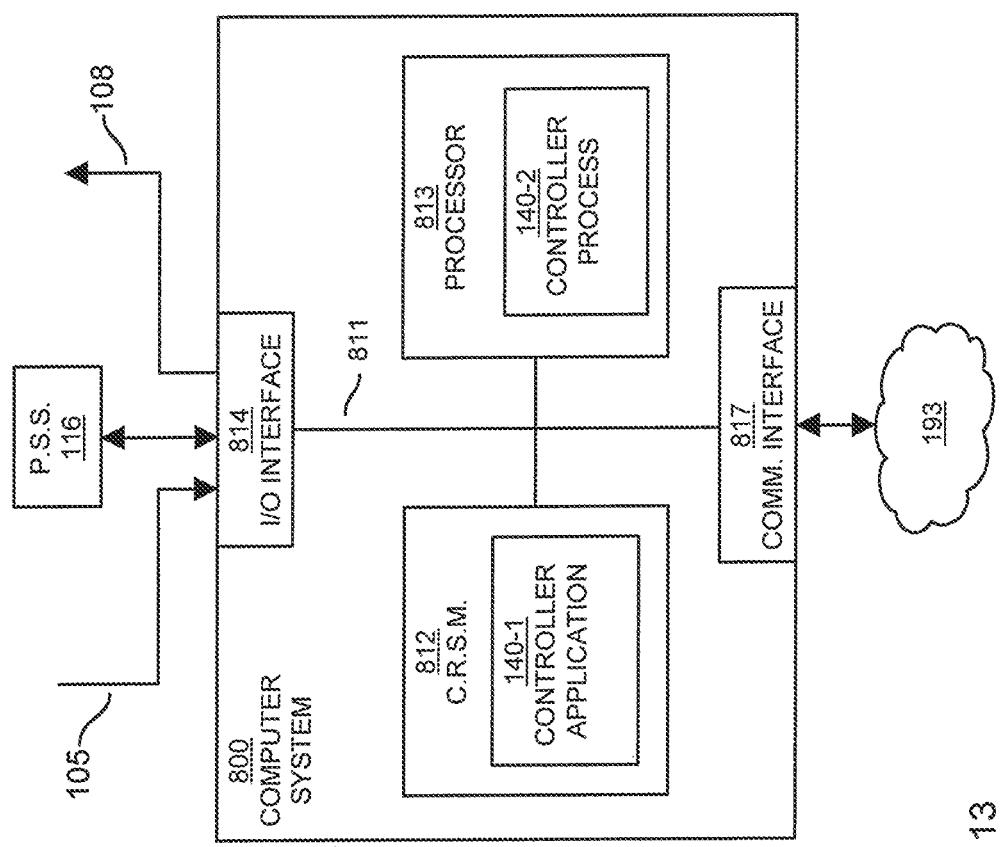
FIG. 13 is an example diagram illustrating computer processor hardware and related software to execute methods according to embodiments herein.

FIG. 12 is an example diagram illustrating modification of gains in a PID circuit according to embodiments herein.

As shown, instead of using the default PID coefficients in the PID controller circuitry 1310, and because the capacitance of the output capacitor circuitry 120 has changed over time, the control signal generator 134 uses the one or more adjusted gain values Kp', Ki', and Kd' to generate control signals 108.

Note that detected variations in the capacitance of the output capacitor circuitry 120 are not limited to adjusting gain values A1, A2, and A3. For example, in accordance with further embodiments, the calculated capacitance measurement associated with the output capacitor circuitry 120 also can be used for adjusting a maximum slew rate of dynamic voltage transitioning of the output voltage 190.

Accordingly, any suitable control parameter of the power supply 100 can be adjusted based upon the measured capacitance of the output capacitor circuitry 120.

Figure 14:
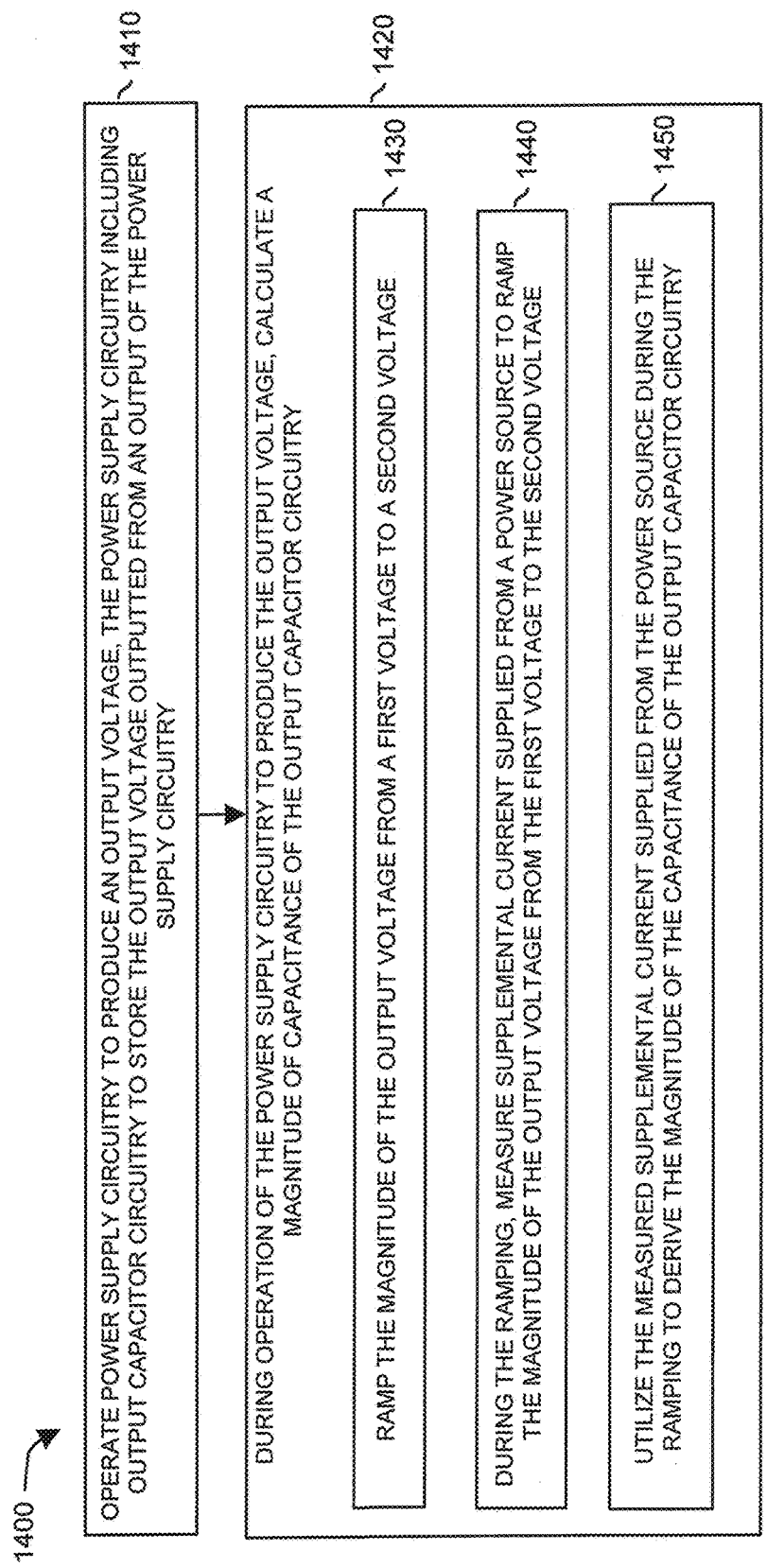
FIGS. 14-15 are example diagrams illustrating methods according to embodiments herein.

FIG. 14 is an example block diagram of a computer device for implementing any of the operations as discussed herein according to embodiments herein.

As previously discussed, the controller circuitry 140 can include computer processor hardware such as computer system 800.

As shown, computer system 800 such as in controller circuitry 140 of the present example includes an interconnect 811 that couples computer readable storage media 812 such as a non-transitory type of media (i.e., any type of hardware storage medium) in which digital information can be stored and retrieved, a processor 813 (e.g., computer processor hardware such as one or more processor devices), I/O interface 814, and a communications interface 817.

I/O interface 814 provides connectivity to receive feedback 105, VIN, etc., as well as to produce control signals 108.

Computer readable storage medium 812 can be any hardware storage resource or device such as memory, optical storage, hard drive, floppy disk, etc. In one embodiment, the computer readable storage medium 812 stores instructions and/or data used by the controller application 140-1 to calculate a capacitance associated with the output capacitor circuitry 120 and control settings of the control circuitry 140 in a manner as previously discussed.

Communications interface 817 enables the computer system 800 and processor 813 to communicate over a resource such as network 193 to retrieve information from remote sources and communicate with other computers.

As shown, computer readable storage media 812 is encoded with controller application 140-1 (e.g., software, firmware, etc.) executed by processor 813. Controller application 140-1 can be configured to include instructions to implement any of the operations as discussed herein.

During operation of one embodiment, processor 813 accesses computer readable storage media 812 via the use of interconnect 811 in order to launch, run, execute, interpret or otherwise perform the instructions in controller application 140-1 stored on computer readable storage medium 812.

Execution of the controller application 140-1 produces processing functionality such as controller process 140-2 in processor 813. In other words, the controller process 140-2 associated with processor 813 represents one or more aspects of executing controller application 140-1 within or upon the processor 813 in the computer system 150.

In accordance with different embodiments, note that computer system may be a micro-controller device configured to control a power supply and perform any of the operations as described herein.

Functionality supported by the different resources will now be discussed via flowcharts in FIGS. 14-15. Note that the steps in the flowcharts below can be executed in any suitable order.

FIG. 14 is a flowchart 1400 illustrating an example method according to embodiments. Note that there will be some overlap with respect to concepts as discussed above.

In processing operation 1410, the controller circuitry 140 operates power supply circuitry 102 to produce an output voltage 190. The power supply circuitry 102 includes output capacitor circuitry 120 to store the output voltage 190 outputted from an output port or pin of the power supply circuitry 102.

In processing operation 1420, during operation of the power supply circuitry 102 to produce the output voltage 190, the controller circuitry 140 calculates a magnitude of capacitance of the output capacitor circuitry 120.

For example, in sub-processing operation 1430, the controller circuitry 140 ramps the magnitude of the output voltage 190 from a first voltage to a second voltage.

In sub-processing operation 1440, during the ramping, the controller circuitry 140 measures supplemental current supplied from or through a power source (such as inductor 144) to ramp the magnitude of the output voltage 190 from the first voltage to the second voltage.

In sub-processing operation 1450, the controller circuitry 140 utilizes the measured supplemental current (such as $I_{CAP}$) supplied from the power source (inductor 144) during the ramping to derive the magnitude of the capacitance of the output capacitor circuitry 120.

Figure 15:
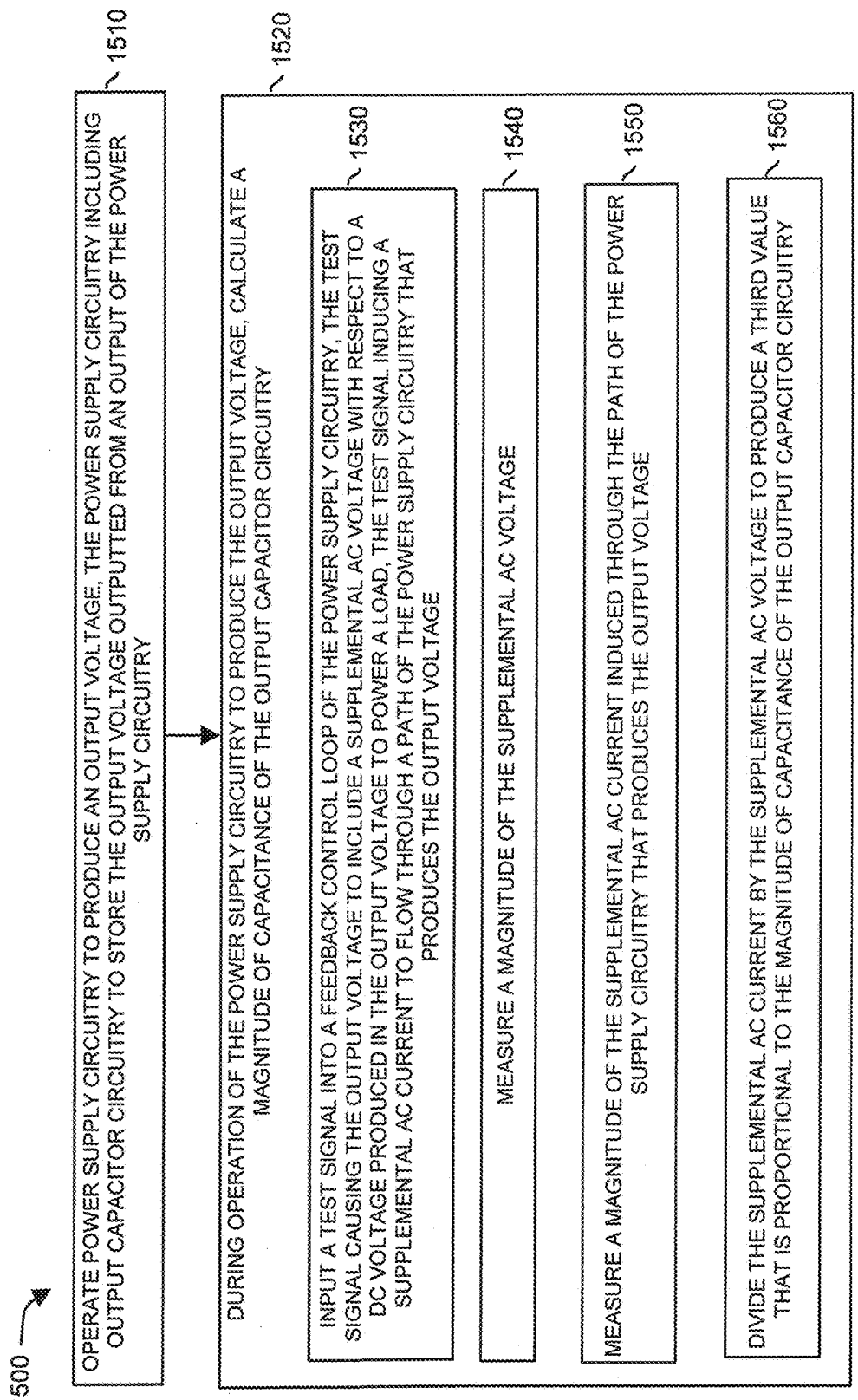

FIG. 15 is a flowchart 1500 illustrating an example method according to embodiments. Note that there will be some overlap with respect to concepts as discussed above.

In processing operation 1510, the controller circuitry 140 operates power supply circuitry 102 to produce an output voltage 190. The power supply circuitry 102 includes output capacitor circuitry 120 to store the output voltage 190 outputted from an output port or pin of the power supply circuitry 102.

In processing operation 1520, during an operation of the power supply circuitry 102 producing the output voltage 190, the controller circuitry 140 initiates calculating a magnitude of capacitance of the output capacitor circuitry 120.

For example, in sub-processing operation 1530, the controller circuitry 140 inputs a test signal (such as offsets signal 510, often signal 610, etc.) into a feedback control loop of the power supply 100. The test signal causes the output voltage 190 to include a supplemental AC voltage with respect to a DC voltage produced in the output voltage 190 to power a load 118. The test signal also induces a supplemental AC current to flow through a path (such through inductor 144) of the power supply circuitry 102 that produces the output voltage 190.

In sub-processing operation 1540, the controller circuitry 140 measures a magnitude of the supplemental AC voltage.

In sub-processing operation 1550, the controller circuitry 140 measures a magnitude of the supplemental AC current.

In sub-processing operation 1560, the controller circuitry 140 divides the supplemental AC current by the supplemental AC voltage to produce a third value proportional to the magnitude of capacitance of the output capacitor circuitry 120.

Note again that techniques herein are well suited for use in power supply applications and calculation of the output capacitance of output capacitor circuitry 120 associated with power supply 100. However, it should be noted that embodiments herein are not limited to use in such applications and that the techniques discussed herein are well suited for other applications as well.

Based on the description set forth herein, numerous specific details have been set forth to provide a thorough understanding of claimed subject matter. However, it will be understood by those skilled in the art that claimed subject matter may be practiced without these specific details. In other instances, methods, apparatuses, systems, etc., that would be known by one of ordinary skill have not been described in detail so as not to obscure claimed subject matter. Some portions of the detailed description have been presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm as described herein, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has been convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

I claim:

1. A method comprising:
   operating power supply circuitry to produce an output voltage within a desired target voltage range to power a load, the power supply circuitry including output capacitor circuitry to store the output voltage outputted from an output of the power supply circuitry; and
   while producing the output voltage within the desired target voltage range and powering the load, varying a magnitude of the output voltage within the desired target voltage range to calculate a magnitude of capacitance of the output capacitor circuitry;
   the method further comprising:
      inducing a supplemental AC current to flow through a path of the power supply circuitry that produces the output voltage; and
      wherein calculating the magnitude of the capacitance of the output capacitor circuitry includes: i) measuring a magnitude of a supplemental AC voltage resulting from the supplemental AC current, and ii) measuring a magnitude of the supplemental AC current induced through the path of the power supply circuitry that produces the output voltage.

2. The method as in claim 1 further comprising:
   adjusting control settings of the power supply circuitry based on the calculated magnitude of the capacitance of the output capacitor circuitry.

3. The method as in claim 2 further comprising:
   repeatedly calculating the magnitude of the capacitance of the output capacitor circuitry at multiple instances over time while powering the load with the output voltage in the desired target voltage range; and
   detecting a change in the magnitude of the capacitance of the output capacitor circuitry.

4. The method as in claim 3, wherein the power supply circuitry includes a PID controller; and
   wherein adjusting control settings of the power supply circuitry includes modifying gain settings of the PID controller of the power supply circuitry in response to detecting the change in the magnitude of the capacitance of the output capacitor circuitry over time.

5. The method as in claim 4, wherein the PID controller includes a first gain stage, a second gain stage, and a third gain stage, the first gain stage disposed in a Proportional-signal path of the PID controller, the second gain stage disposed in an Integrator-signal path of the PID controller, the third gain stage disposed in a Derivative-signal path of the PID controller; and
   wherein modifying the gain settings of the PID controller includes: modifying magnitude settings of at least one gain stage in the group consisting of: the first gain stage, the second gain stage, and the third gain stage to account for the change in magnitude of the capacitance of the output capacitor circuitry.

6. The method as in claim 1, wherein calculating the magnitude of the capacitance of the output capacitor circuitry includes:
   measuring a surplus of current relative to a load current consumed by the load, the surplus of load current charging the output capacitor circuitry.

7. The method as in claim 1, wherein varying the magnitude of the output voltage includes: ramping the magnitude of the output voltage from a first voltage to a second voltage; and wherein calculating the magnitude of the capacitance of the output capacitor circuitry includes: i) during the ramping, measuring supplemental current supplied from a power source to ramp the magnitude of the output voltage from the first voltage to the second voltage; and ii) utilizing the measured supplemental current supplied from the power source during the ramping to derive the magnitude of the capacitance of the output capacitor circuitry.

8. The method as in claim 7, wherein the measured supplemental current supplied from the power source represents current charging the output capacitor circuitry of the power supply circuitry.

9. A method comprising:
operating power supply circuitry to produce an output voltage, the power supply circuitry including output capacitor circuitry to store the output voltage;
during operation of the power supply circuitry to produce the output voltage, calculating a magnitude of capacitance of the output capacitor circuitry; and
wherein calculating the magnitude of capacitance of the output capacitor circuitry includes:
receiving a current value indicative of an amount of current supplied through a path of the power supply circuitry to charge the output capacitor circuitry;
receiving a slew rate value indicating an applied change in the magnitude of the output voltage over time; and
dividing the current value by the slew rate value to estimate the magnitude of capacitance of the output capacitor circuitry.

10. The method as in claim 9 further comprising:
measuring the current value and the slew rate value within a range of time in which the path of the power supply circuitry supplies current to both a load and the output capacitor circuitry.

11. The method as in claim 1 further comprising:
inputting a test signal into a feedback control loop of the power supply circuitry to measure the magnitude of capacitance of the output capacitor circuitry, the test signal causing the output voltage to include the supplemental AC voltage with respect to a DC voltage component of the output voltage used to power the load.

12. The method as in claim 11, wherein the inputted test signal modifies an error voltage in the feedback control loop of the power supply circuitry that produces the output voltage.

13. The method as in claim 11, wherein the inputted test signal modifies duty cycle settings in the feedback control loop of the power supply circuitry that produces the output voltage.

14. The method as in claim 11, wherein calculating the magnitude of the capacitance of the output capacitor circuitry further includes:
retrieving a first value representing a peak-to-peak measurement of the supplemental AC voltage;
retrieving a second value representing a peak-to-peak measurement of the supplemental AC current; and
dividing the second value by the first value to produce a third value proportional to the magnitude of capacitance of the output capacitor circuitry.

15. The method as in claim 11 further comprising:
generating the test signal at a base frequency that is substantially less than a switching frequency of respective switch circuitry in the power supply circuitry that generates the output voltage.

16. The method as in claim 1, wherein operating power supply circuitry to produce the output voltage includes: outputting the output voltage to the load using at least one DC/DC stage of multiple DC/DC stages.

17. Computer-readable storage hardware having instructions stored thereon, the instructions when executed by computer processor hardware cause the computer processor hardware to perform operations of:
controlling power supply circuitry to produce an output voltage, the power supply circuit including output capacitor circuitry to store the output voltage outputted from an output of the power supply circuitry; and
during operation of the power supply circuitry and producing the output voltage to be within a desired target voltage range to power a respective load, varying a magnitude of the output voltage to calculate a magnitude of capacitance of the output capacitor circuitry;
inducing a supplemental AC current to flow through a path of the power supply circuitry that produces the output voltage; and
wherein calculating the magnitude of the capacitance of the output capacitor circuitry includes: i) measuring a magnitude of a supplemental AC voltage resulting from the supplemental AC current, and ii) measuring a magnitude of the supplemental AC current induced through the path of the power supply circuitry that produces the output voltage.

18. The computer-readable storage hardware method as in claim 17, wherein the computer processor hardware further performs operations of:
adjusting control settings of the power supply circuitry based on the calculated magnitude of the capacitance of the output capacitor circuitry.

19. A device comprising:
control circuitry, the control circuitry operable to:
control power supply circuitry to produce an output voltage within a desired target voltage range to power a load, the power supply circuitry including output capacitor circuitry to store the output voltage; and
while producing the output voltage within the desired target voltage range, vary a magnitude of the output voltage to calculate a magnitude of capacitance of the output capacitor circuitry;
induce a supplemental AC current to flow through a path of the power supply circuitry that produces the output voltage; and
wherein the control circuitry, when calculating the magnitude of the capacitance of the output capacitor circuitry, is further operable to: i) measure a magnitude of a supplemental AC voltage resulting from the supplemental AC current, and ii) measure a magnitude of the supplemental AC current induced through the path of the power supply circuitry that produces the output voltage.

20. The device as in claim 19, wherein the control circuitry is further operable to adjust control settings of the power supply circuitry based on the calculated magnitude of the capacitance of the output capacitor circuitry.

21. The device as in claim 20, wherein the control circuitry is further operable to:
repeatedly calculate the magnitude of the capacitance of the output capacitor circuitry at multiple instances over time; and
detect a change in the magnitude of the capacitance of the output capacitor circuitry based on the repeated calculations.

22. The device as in claim 21, wherein the power supply circuitry includes a PID controller; and wherein the control circuitry is further operable to modify gain settings of the PID controller of the power supply circuitry in response to detecting the change in the magnitude of the capacitance of the output capacitor circuitry over time.

23. The device as in claim 22, wherein the PID controller includes a first gain stage, a second gain stage, and a third gain stage;
the first gain stage disposed in a Proportional-signal path of the PID controller, the second gain stage disposed in an Integrator-signal path of the PID controller, the third gain stage disposed in a Derivative-signal path of the PID controller; and
wherein the control circuitry is further operable to modify magnitude settings of at least one gain stage in the group consisting of the first gain stage, the second gain stage, and the third gain stage to account for the change in magnitude of the capacitance of the output capacitor circuitry.

24. The device as in claim 19, wherein the control circuitry is further operable to measure a surplus of current relative to a load current consumed by a load powered by the output voltage to determine a magnitude of the capacitance, the surplus of current charging the output capacitor circuitry.

25. The device as in claim 19, wherein the control circuitry is further operable to ramp the magnitude of the output voltage from a first voltage to a second voltage; and
wherein the control circuitry is further operable to: i) during ramping from a first voltage to a second voltage within the desired target voltage range, measure supplemental current supplied from a power source to ramp the magnitude of the output voltage from the first voltage to the second voltage; and ii) utilize the measured supplemental current supplied from the power source during the ramping to derive the magnitude of the capacitance of the output capacitor circuitry.

26. The device as in claim 25, wherein the measured supplemental current supplied from the power source represents current charging the output capacitor circuitry of the power supply circuitry.

27. A device comprising:
control circuitry, the control circuitry operable to:
control power supply circuitry to produce an output voltage, the power supply circuitry including output capacitor circuitry to store the output voltage outputted from an output of the power supply circuitry; and
calculate a magnitude of capacitance of the output capacitor circuitry during operation of the power supply circuitry to produce the output voltage;
wherein the control circuitry is further operable to:
obtain a current value indicative of an amount of current supplied through a path of the power supply circuitry to charge the output capacitor circuitry;
receive a slew rate value indicating an applied change in the magnitude of the output voltage over time; and
divide the current value by the slew rate value to estimate the magnitude of the output capacitor circuitry.

28. The device as in claim 27, wherein the control circuitry is further operable to measure the current value and the slew rate value within a range of time in which the path of the power supply circuitry supplies current to both a load and the output capacitor circuitry.

29. The device as in claim 28, wherein the control circuitry is further operable to input a test signal into a feedback control loop of the power supply circuitry regulating the output voltage at a desired voltage set point, the test signal causing the output voltage to include a supplemental AC voltage with respect to a DC voltage component produced in the output voltage to power the load.

30. The device as in claim 29, wherein the inputted test signal modifies an error voltage in a feedback control loop of the power supply circuitry that produces the output voltage.

31. The device as in claim 29, wherein the inputted test signal modifies duty cycle settings in a feedback control loop of the power supply circuitry that produces the output voltage.

32. The device as in claim 29, wherein the test signal further causes generation of a supplemental AC current to flow through a path of the power supply circuitry that provides the output voltage; and
wherein the control circuitry is further operable to calculate the magnitude of the capacitance of the output capacitor circuitry based on: i) measuring a magnitude of the supplemental AC voltage, and ii) measuring a magnitude of the supplemental AC current passing through the path of the power supply circuitry that provides the output voltage.

33. The device as in claim 32, wherein the control circuitry is further operable to:
obtain a first value representing a peak-to-peak measurement of the supplemental AC voltage;
obtain a second value representing a peak-to-peak measurement of the supplemental AC current; and
divide the second value by the first value to produce a third value that is proportional to the magnitude of capacitance of the output capacitor circuitry.

34. The device as in claim 29, wherein the test signal is generated at a base frequency that is substantially less than a switching frequency of respective switch circuitry in the power supply circuitry that generates the output voltage.

35. The device as in claim 29, wherein the control circuitry is further operable to correlate the supplemental AC voltage with a corresponding supplemental AC current induced by the test signal to calculate the magnitude of the capacitance of the output capacitor circuitry.

36. The device as in claim 19, wherein the control circuitry is further operable to control at least one DC/DC stage of multiple DC/DC stages that produce the output voltage to power the load.

37. The computer-readable storage hardware method as in claim 17, wherein the computer processor hardware further performs operations of:
controlling at least one DC/DC stage of multiple DC/DC stages to produce the output voltage.

38. The method as in claim 1, wherein varying the magnitude of the output voltage includes: ramping the magnitude of the output voltage from a first voltage to a second voltage.

39. The method as in claim 38, wherein the first voltage and the second voltage both reside within the desired target voltage range.

40. The device as in claim 19, wherein the control circuitry is further operable to:
inject a signal onto the output voltage to vary the magnitude of the output voltage; and
measure a magnitude of capacitance of the output capacitor circuitry based on the injected signal.

41. The device as in claim 19, wherein the control circuitry is further operable to:

obtain a first value indicating an amount of current supplied by the output voltage to both the load and the output capacitor circuitry based on the varied magnitude of the output voltage;

receive a second value indicating a rate of voltage change associated with the output voltage; and utilize the first value and the second value to calculate the magnitude of the output capacitor circuitry.

42. The device as in claim 19, wherein the control circuitry is further operable to:

vary the magnitude of the output voltage within the desired target voltage range to calculate the magnitude of the capacitance;

identify an estimated amount of current supplied by the output voltage to the output capacitor circuitry; and utilize the estimated amount of current to calculate the magnitude of the output capacitor circuitry.

43. The device as in claim 19, wherein the control circuitry is further operable to: ramp the magnitude of the output voltage within the desired target voltage range to vary the output voltage.

* * * * *